US012609074B2

(12) United States Patent
    Huang et al.

(10) Patent No.: US 12,609,074 B2
(45) Date of Patent: Apr. 21, 2026

(54) PIXEL ARRAY

(71) Applicant: AUO Corporation, Hsinchu City (TW)

(72) Inventors: Yu-Sheng Huang, Hsinchu City (TW); Chia-Chun Chang, Hsinchu City (TW); Chun-Liang Lin, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 0 days.

(21) Appl. No.: 18/931,097

(22) Filed: Oct. 30, 2024

(65) Prior Publication Data

US 2026/0004709 A1 Jan. 1, 2026

(30) Foreign Application Priority Data

Jun. 26, 2024 (TW) ................................ 113123882
Sep. 30, 2024 (TW) ................................ 113137292

(51) Int. Cl.
    *G09G 3/32*       (2016.01)
    *H10D 86/40*      (2025.01)
    *H10D 86/60*      (2025.01)

(52) U.S. Cl.
    CPC ............. *G09G 3/32* (2013.01); *H10D 86/441* (2025.01); *H10D 86/60* (2025.01); *G09G 2300/0452* (2013.01); *G09G 2320/02* (2013.01); *G09G 2330/021* (2013.01)

(58) Field of Classification Search
    CPC .................. G09G 3/32; G09G 3/2003; G09G 2300/0452; G09G 2300/0426; G09G 2300/0804; G09G 2320/02; H01L 25/167; H10D 86/441; H10D 86/60; H10H 20/857; H10H 29/14
    See application file for complete search history.

(56) References Cited

U.S. PATENT DOCUMENTS

| | | | |
|---|---|---|---|
| 10,355,141 B1 | 7/2019 | Du et al. | |
| 12,283,231 B2 | 4/2025 | Chen et al. | |
| 2019/0221675 A1 | 7/2019 | Du et al. | |
| 2021/0336078 A1* | 10/2021 | Fan | .................. H10H 20/01335 |
| 2022/0336523 A1* | 10/2022 | Hsieh | ...................... H10H 29/14 |
| 2022/0415247 A1* | 12/2022 | Liao | ...................... H01L 25/167 |
| 2023/0094050 A1 | 3/2023 | Huang et al. | |

(Continued)

FOREIGN PATENT DOCUMENTS

| | | |
|---|---|---|
| TW | 201933061 | 8/2019 |
| TW | 202424935 | 6/2024 |

*Primary Examiner* — Xuemei Zheng
(74) *Attorney, Agent, or Firm* — JCIPRNET

(57) ABSTRACT

Disclosed is a pixel array. The pixel array includes multiple pixel driving circuits and multiple light-emitting diodes. The pixel driving circuits are individually coupled to one of multiple scan lines to receive a scan signal, coupled to one of multiple light-emitting lines to receive a light-emitting signal, and coupled to one of multiple data lines to receive a pixel data. The light-emitting diodes are arranged in an array. An anode of a first light-emitting diode of the light-emitting diodes is coupled to one of the pixel driving circuits, and a cathode of the first light-emitting diode is coupled to an anode of a second light-emitting diode of the light-emitting diodes of the same color as the first light-emitting diode. A cathode of the second light-emitting diode receives a system low voltage.

19 Claims, 11 Drawing Sheets

1000

(56)  References Cited

U.S. PATENT DOCUMENTS

2023/0215326 A1* 7/2023 Lee ...................... G09G 3/2014
345/690
2023/0375879 A1* 11/2023 Park .................. G02F 1/133601
2024/0185771 A1 6/2024 Chen et al.

* cited by examiner

PIXEL ARRAY

CROSS-REFERENCE TO RELATED APPLICATION

This application claims the priority benefit of Taiwan application serial no. 113123882, filed on Jun. 26, 2024 and Taiwan application serial no. 113137292, filed on Sep. 30, 2024. The entirety of each of the above-mentioned patent applications is hereby incorporated by reference herein and made a part of this specification.

BACKGROUND

Technical Field

The disclosure relates to a pixel array, and in particular to a pixel array related to a light-emitting diode.

Description of Related Art

Display technologies, aside from basic liquid crystal displays (LCD), include advanced display technologies such as active-matrix organic light-emitting diodes (AMOLED), mini light-emitting diodes (LED), and micro LEDs. Currently, the technologies mostly seen in everyday life are AMOLEDs and mini LEDs, as micro LEDs are still in development. However, micro LEDs have features such as high contrast, low power consumption, and long lifespan. Thus, micro LEDs have the potential of being an environmentally friendly next-generation display technology, making micro LEDs highly anticipated.

In consideration of cost and power consumption, micro LEDs are arranged by means of Pentile pixels. However, the actual resolution achieved through the arrangement by means of Pentile pixels is only two-thirds of the nominal resolution. At lower resolutions, the screen appears to be very grainy, leading to problems of grid points in terms of visual effects.

SUMMARY

The disclosure provides a pixel array to reduce power consumption of light-emitting diodes and prevent problems of grid points in terms of visual effects.

A pixel array of the disclosure includes multiple pixel driving circuits and multiple light-emitting diodes. The pixel driving circuits are individually coupled to one of multiple scan lines to receive a scan signal, coupled to one of multiple light-emitting lines to receive a light-emitting signal, and coupled to one of multiple data lines to receive a pixel data. The light-emitting diodes are arranged in an array. An anode of a first light-emitting diode of the light-emitting diodes is coupled to one of the pixel driving circuits, and a cathode of the first light-emitting diode is coupled to an anode of a second light-emitting diode of the light-emitting diodes of the same color as the first light-emitting diode. A cathode of the second light-emitting diode receives a system low voltage.

Based on the above, in the pixel array in an embodiment of the disclosure, the light-emitting diodes are driven in groups according to color. However, the light-emitting diodes lighting up at the same time are located in different positions. Thus, the pixel array reduces power consumption of light-emitting diodes and prevents problems of grid points in terms of visual effects.

To make the features and advantages of the disclosure more comprehensible, several embodiments accompanied with drawings are described in detail as follows.

DESCRIPTION OF THE EMBODIMENTS

Unless otherwise defined, all terms (including technical and scientific terms) used herein have the same meaning as commonly understood by those of ordinary skill in the art. It will be further understood that terms such as those defined in commonly used dictionaries should be interpreted as having meanings consistent with their meanings in the context of related technologies and the present disclosure, and will not be interpreted in an idealized or excessively formal sense unless explicitly defined as such in this article.

It should be understood that although the terms "first", "second", "third", etc. may be used herein to describe various elements, components, regions, layers and/or parts, these elements, components, regions, and/or parts should not be restricted by these terms. These terms are only used to distinguish one element, component, region, layer or part from another element, component, region, layer or part. Therefore, the "first element", "first component", "first region", "first layer" or "first part" discussed below may be referred to as a second element, second component, second region, second layer or second part without departing from the teachings herein.

The terms used herein are only for the purpose of describing specific embodiments, and are not restrictive. As used herein, unless the content clearly indicates otherwise, the singular forms "a", "an" and "the" are intended to involve the plural forms, including "at least one"; "or" means "and/or". As used herein, the term "and/or" includes any and all combinations of one or more related listed items. It should also be understood that when used in this specification, the terms "including" and/or "comprising" designate the presence of the features, regions, wholes, steps, operations, elements, and/or components, but do not exclude the presence or addition of one or more other features, overall regions, steps, operations, elements, components, and/or combinations thereof.

Figure 1:
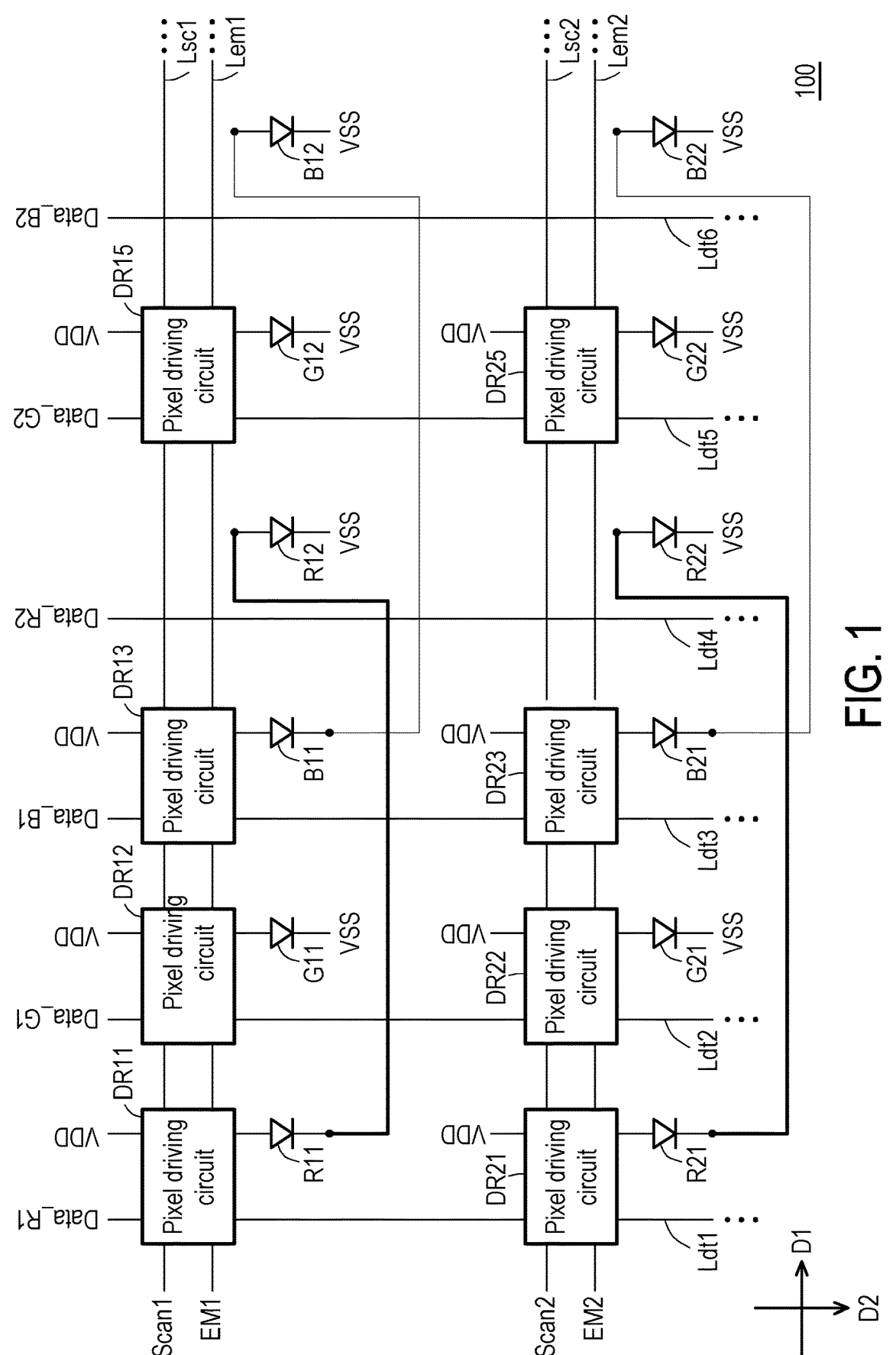
FIG. 1 is a system schematic diagram of a pixel array according to a first embodiment of the disclosure.

FIG. 1 is a system schematic diagram of a pixel array according to a first embodiment of the disclosure. Referring to FIG. 1, in this embodiment, a pixel array 100 includes multiple pixel driving circuits (exemplified by DR11 to DR13, DR15, DR21 to DR23, and DR25) and multiple light-emitting diodes (LED, exemplified by red LEDs R11, R12, R21, and R22; green LEDs G11, G12, G21, and G22; and blue LEDs B11, B12, B21, and B22). The red LEDs R11, R12, R21, and R22, the green LEDs G11, G12, G21, and G22, and the blue LEDs B11, B12, B21, and B22 may be micro LEDs. The pixel driving circuits DR11 to DR13, DR15, DR21 to DR23, and DR25 commonly receive a system high voltage VDD.

The pixel driving circuits DR11 to DR13 and DR15 are commonly coupled to a scan line Lsc1 to receive a scan signal Scan1. The pixel driving circuits DR21 to DR23 and DR25 are commonly coupled to a scan line Lsc2 to receive a scan signal Scan2. The pixel driving circuits DR11 to DR13 and DR15 are commonly coupled to a light-emitting line Lem1 to receive a light-emitting signal EM1. The pixel driving circuits DR21 to DR23 and DR25 are commonly coupled to a light-emitting line Lem2 to receive a light-emitting signal EM2. The pixel driving circuits DR11 and DR21 are coupled to a data line Ldt1 to receive a pixel data Data_R1. The pixel driving circuits DR12 and DR22 are coupled to a data line Ldt2 to receive a pixel data Data_G1. The pixel driving circuits DR13 and DR23 are coupled to a data line Ldt3 to receive a pixel data Data_B1. The pixel driving circuits DR15 and DR25 are coupled to a data line Ldt5 to receive a pixel data Data_G2.

An anode of the red LED R11 (corresponding to a first LED or a third LED) is coupled to the pixel driving circuit DR11 (corresponding to a first pixel driving circuit or a second pixel driving circuit). A cathode of the red LED R11 is, along a first direction D1 in which the scan lines Lsc1 and Lsc2 extend, coupled to an anode of the red LED R12 (corresponding to a second LED or a fourth LED) of the same color as the red LED R11. A cathode of the red LED R12 receives a system low voltage VSS. That is, the red LEDs R11 and R12 are connected in series to the pixel driving circuit DR11 and the system low voltage VSS. The green LED G11 is connected in series between the pixel driving circuit DR12 and the system low voltage VSS.

An anode of the blue LED B11 (corresponding to the first LED or the third LED) is coupled to the pixel driving circuit DR13 (corresponding to a first pixel driving circuit or a second pixel driving circuit). A cathode of the blue LED B11 is, along the first direction D1 in which the scan lines Lsc1 and Lsc2 extend, coupled to an anode of the blue LED B12 (corresponding to the second LED or the fourth LED) of the same color as the blue LED B11. A cathode of the blue LED B12 receives the system low voltage VSS. That is, the blue LEDs B11 and B12 are connected in series to the pixel driving circuit DR13 and the system low voltage VSS. The green LED G12 is connected in series between the pixel driving circuit DR15 and the system low voltage VSS.

An anode of the red LED R21 (corresponding to the first LED or the third LED) is coupled to the pixel driving circuit DR21 (corresponding to a first pixel driving circuit or a second pixel driving circuit). A cathode of the red LED R21 is, along the first direction D1 in which the scan lines Lsc1 and Lsc2 extend, coupled to an anode of the red LED R22 (corresponding to the second LED or the fourth LED) of the same color as the red LED R21. A cathode of the red LED R22 receives the system low voltage VSS. That is, the red LEDs R21 and R22 are connected in series to the pixel driving circuit DR21 and the system low voltage VSS. The green LED G21 is connected in series between the pixel driving circuit DR22 and the system low voltage VSS.

An anode of the blue LED B21 (corresponding to the first LED or the third LED) is coupled to the pixel driving circuit DR23 (corresponding to a first pixel driving circuit or a second pixel driving circuit). A cathode of the blue LED B21 is, along the first direction D1 in which the scan lines Lsc1 and Lsc2 extend, coupled to an anode of the blue LED B22 (corresponding to the second LED or the fourth LED) of the same color as the blue LED B21. A cathode of the blue LED B22 receives the system low voltage VSS. That is, the blue LEDs B21 and B22 are connected in series to the pixel driving circuit DR23 and the system low voltage VSS. The green LED G22 is connected in series between the pixel driving circuit DR25 and the system low voltage VSS.

Accordingly, the more sensitive green LEDs G11, G12, G21, and G22 are independently driven, while the less sensitive red LEDs R11, R12, R21, and R22 as well as the blue LEDs B11, B12, B21, and B22 are driven in groups according to color. However, the red LEDs R11, R12, R21, and R22 as well as the blue LEDs B1, B12, B21, and B22 lighting up at the same time are located in different positions. Thus, the pixel array 100 reduces power consumption of LEDs and prevents problems of grid points in terms of visual effects.

Figure 2:
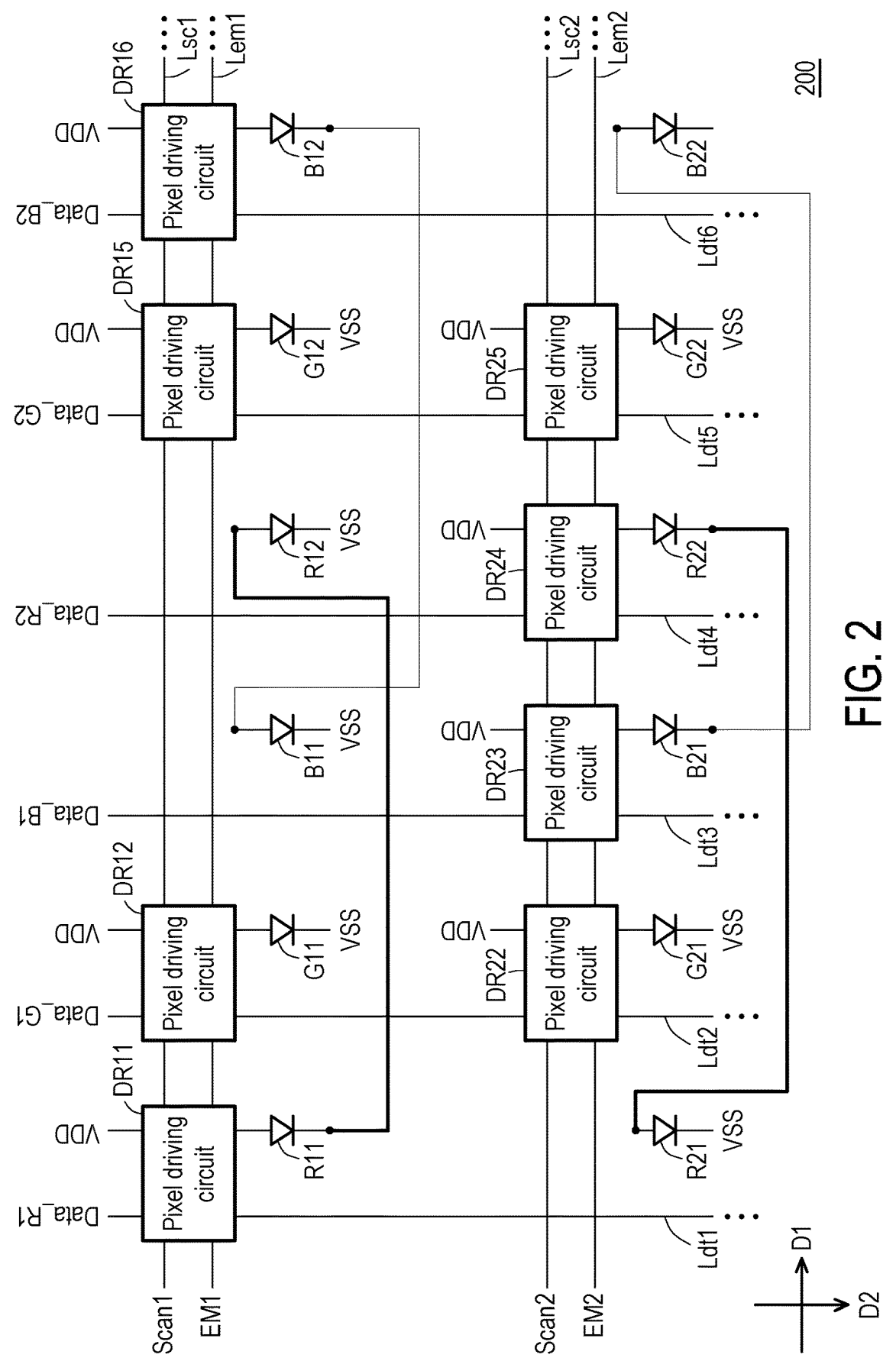
FIG. 2 is a system schematic diagram of a pixel array according to a second embodiment of the disclosure.

FIG. 2 is a system schematic diagram of a pixel array according to a second embodiment of the disclosure. Referring to FIG. 2, in this embodiment, a pixel array 200 includes multiple pixel driving circuits (exemplified by DR11, DR12, DR15, DR16, DR22, DR23, DR24, and DR25) and multiple LEDs (exemplified by the red LEDs R11, R12, R21, and R22; the green LEDs G11, G12, G21, and G22; and the blue LEDs B11, B12, B21, and B22). The pixel driving circuits DR11, DR12, DR15, DR16, DR22, DR23, DR24, and DR25 commonly receive the system high voltage VDD.

The pixel driving circuits DR11, DR12, DR15, and DR16 are commonly coupled to the scan line Lsc1 to receive the scan signal Scan1. The pixel driving circuits DR22, DR23, DR24, and DR25 are commonly coupled to the scan line Lsc2 to receive the scan signal Scan2. The pixel driving circuits DR11, DR12, DR15, and DR16 are commonly coupled to the light-emitting line Lem1 to receive the light-emitting signal EM1. The pixel driving circuits DR22, DR23, DR24, and DR25 are commonly coupled to the light-emitting line Lem2 to receive the light-emitting signal EM2. The pixel driving circuit DR11 is coupled to the data line Ldt1 to receive the pixel data Data_R1. The pixel driving circuits DR12 and DR22 are coupled to the data line Ldt2 to receive the pixel data Data_G1. The pixel driving circuit DR23 is coupled to the data line Ldt3 to receive the pixel data Data_B1. The pixel driving circuit DR24 is coupled to a data line Ldt4 to receive a pixel data Data_R2. The pixel driving circuits DR15 and DR25 are coupled to the data line Ldt5 to receive the pixel data Data_G2. The pixel driving circuit DR26 is coupled to a data line Ldt6 to receive a pixel data Data_B2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along the first direction D1 in which the scan lines Lsc1 and Lsc2 extend, coupled to the anode of the red LED R12 (corresponding to the second LED or the fourth LED) of the same color as the red LED R11. The cathode of the red LED R12 receives the system low voltage VSS. That is, the red LEDs R11 and R12 are connected in series to the pixel driving circuit DR11 and the system low voltage VSS. The green LED G11 is connected in series between the pixel driving circuit DR12 and the system low voltage VSS.

The green LED G12 is connected in series between the pixel driving circuit DR15 and the system low voltage VSS. The anode of the blue LED B12 (corresponding to the first LED or the third LED) is coupled to the pixel driving circuit DR16 (corresponding to a first pixel driving circuit or a second pixel driving circuit). The cathode of the blue LED B12 is, along a direction opposite to the first direction D1 in which the scan lines Lsc1 and Lsc2 extend, coupled to the anode of the blue LED B11 (corresponding to the second LED or the fourth LED) of the same color as the blue LED B12. The cathode of the blue LED B11 receives the system low voltage VSS. That is, the blue LEDs B11 and B12 are connected in series to the pixel driving circuit DR16 and the system low voltage VSS.

The green LED G21 is connected in series between the pixel driving circuit DR22 and the system low voltage VSS. The anode of the blue LED B21 (corresponding to the first LED or the third LED) is coupled to the pixel driving circuit DR23 (corresponding to a first pixel driving circuit or a second pixel driving circuit). The cathode of the blue LED B21 is, along the first direction D1 in which the scan lines Lsc1 and Lsc2 extend, coupled to the anode of the blue LED B22 (corresponding to the second LED or the fourth LED) of the same color as the blue LED B21. The cathode of the blue LED B22 receives the system low voltage VSS. That is, the blue LEDs B21 and B22 are connected in series to the pixel driving circuit DR23 and the system low voltage VSS.

The anode of the red LED R22 (corresponding to the first LED or the third LED) is coupled to the pixel driving circuit DR24 (corresponding to a first pixel driving circuit or a second pixel driving circuit). The cathode of the red LED R22 is, along the direction opposite to the first direction D1 in which the scan lines Lsc1 and Lsc2 extend, coupled to the anode of the red LED R21 (corresponding to the second LED or the fourth LED) of the same color as the red LED R22. The cathode of the red LED R21 receives the system low voltage VSS. That is, the red LEDs R21 and R22 are connected in series to the pixel driving circuit DR24 and the system low voltage VSS. The green LED G22 is connected in series between the pixel driving circuit DR25 and the system low voltage VSS.

Figure 3:
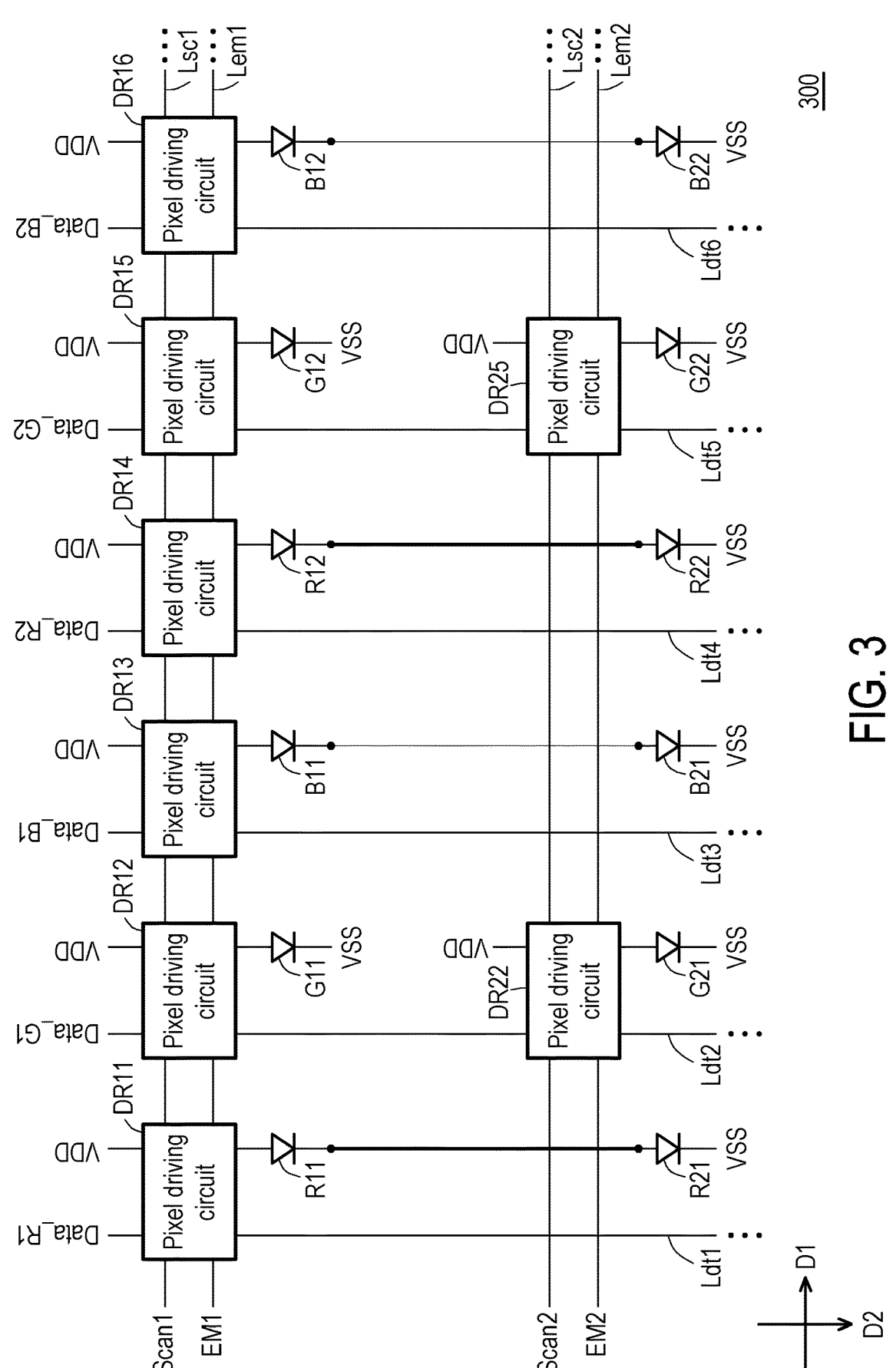
FIG. 3 is a system schematic diagram of a pixel array according to a third embodiment of the disclosure.

FIG. 3 is a system schematic diagram of a pixel array according to a third embodiment of the disclosure. Referring to FIG. 3, in this embodiment, a pixel array 300 includes multiple pixel driving circuits (exemplified by DR11 to DR16, DR22, and DR25) and multiple LEDs (exemplified by the red LEDs R11, R12, R21, and R22; the green LEDs G11, G12, G21, and G22; and the blue LEDs B1, B12, B21, and B22). The pixel driving circuits DR11 to DR16, DR22, and DR25 commonly receive the system high voltage VDD.

The pixel driving circuits DR11 to DR16 are commonly coupled to the scan line Lsc1 to receive the scan signal Scan1. The pixel driving circuits DR22 and DR25 are commonly coupled to the scan line Lsc2 to receive the scan signal Scan2. The pixel driving circuits DR11 to DR16 are commonly coupled to the light-emitting line Lem1 to receive the light-emitting signal EM1. The pixel driving circuits DR22 and DR25 are commonly coupled to the light-emitting line Lem2 to receive the light-emitting signal EM2. The pixel driving circuit DR11 is coupled to the data line Ldt1 to receive the pixel data Data_R1. The pixel driving circuits DR12 and DR22 are coupled to the data line Ldt2 to receive the pixel data Data_G1. The pixel driving circuit DR13 is coupled to the data line Ldt3 to receive the pixel data Data_B1. The pixel driving circuit DR14 is coupled to the data line Ldt4 to receive the pixel data Data_R2. The pixel driving circuits DR15 and DR25 are coupled to the data line Ldt5 to receive the pixel data Data_G2. The pixel driving circuit DR16 is coupled to the data line Ldt6 to receive the pixel data Data_B2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along a second direction D2 in which the data lines Ldt1 to Ldt6 extend, coupled to the anode of the red LED R21 (corresponding to the second LED or the fourth LED) of the same color as the red LED R11. The cathode of the red LED R21 receives the system low voltage VSS. That is, the red LEDs R11 and R21 are connected in series to the pixel driving circuit DR11 and the system low voltage VSS. The green LED G11 is connected in series between the pixel driving circuit DR12 and the system low voltage VSS.

The anode of the blue LED B11 (corresponding to the first LED or the third LED) is coupled to the pixel driving circuit DR13 (corresponding to a first pixel driving circuit or a second pixel driving circuit). The cathode of the blue LED B11 is, along the second direction D2 in which the data lines Ldt1 to Ldt6 extend, coupled to the anode of the blue LED B21 (corresponding to the second LED or the fourth LED) of the same color as the blue LED B11. The cathode of the blue LED B21 receives the system low voltage VSS. That is, the blue LEDs B11 and B21 are connected in series to the pixel driving circuit DR13 and the system low voltage VSS.

The anode of the red LED R12 (corresponding to the first LED or the third LED) is coupled to the pixel driving circuit DR14 (corresponding to a first pixel driving circuit or a second pixel driving circuit). The cathode of the red LED R12 is, along the second direction D2 in which the data lines Ldt1 to Ldt6 extend, coupled to the anode of the red LED R22 (corresponding to the second LED or the fourth LED) of the same color as the red LED R12. The cathode of the red LED R22 receives the system low voltage VSS. That is, the red LEDs R12 and R22 are connected in series to the pixel driving circuit DR14 and the system low voltage VSS. The green LED G12 is connected in series between the pixel driving circuit DR15 and the system low voltage VSS.

The anode of the blue LED B12 (corresponding to the first LED or the third LED) is coupled to the pixel driving circuit DR16 (corresponding to a first pixel driving circuit or a second pixel driving circuit). The cathode of the blue LED B12 is, along the second direction D2 in which the data lines Ldt1 to Ldt6 extend, coupled to the anode of the blue LED B22 (corresponding to the second LED or the fourth LED) of the same color as the blue LED B12. The cathode of the blue LED B22 receives the system low voltage VSS. That is, the blue LEDs B12 and B22 are connected in series to the pixel driving circuit DR16 and the system low voltage VSS.

The green LED G21 is connected in series between the pixel driving circuit DR22 and the system low voltage VSS. The green LED G22 is connected in series between the pixel driving circuit DR25 and the system low voltage VSS.

Figure 4:
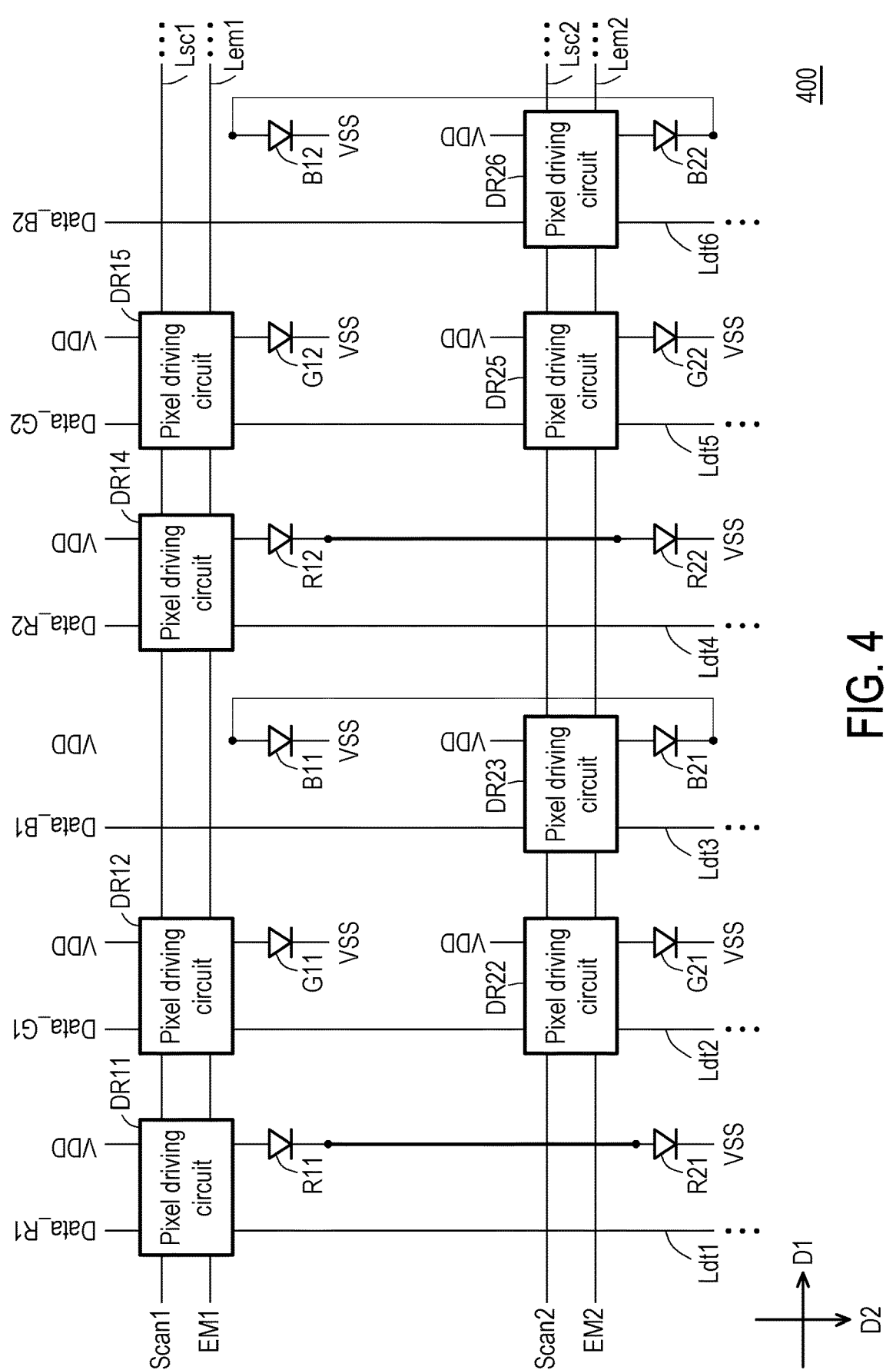
FIG. 4 is a system schematic diagram of a pixel array according to a fourth embodiment of the disclosure.

FIG. 4 is a system schematic diagram of a pixel array according to a fourth embodiment of the disclosure. Referring to FIG. 4, in this embodiment, a pixel array 400 includes multiple pixel driving circuits (exemplified by DR11, DR12, DR14, DR15, DR22, DR23, DR25, and DR26) and multiple LEDs (exemplified by the red LEDs R11, R12, R21, and R22; the green LEDs G11, G12, G21, and G22; and the blue LEDs B11, B12, B21, and B22). The pixel driving circuits DR11, DR12, DR14, DR15, DR22, DR23, DR25, and DR26 commonly receive the system high voltage VDD.

The pixel driving circuits DR11, DR12, DR14, and DR15 are commonly coupled to the scan line Lsc1 to receive the scan signal Scan1. The pixel driving circuits DR22, DR23, DR25, and DR26 are commonly coupled to the scan line Lsc2 to receive the scan signal Scan2. The pixel driving circuits DR11, DR12, DR14, and DR15 are commonly coupled to the light-emitting line Lem1 to receive the light-emitting signal EM1. The pixel driving circuits DR22, DR23, DR25, and DR26 are commonly coupled to the light-emitting line Lem2 to receive the light-emitting signal EM2. The pixel driving circuit DR11 is coupled to the data line Ldt1 to receive the pixel data Data_R1. The pixel driving circuits DR12 and DR22 are coupled to the data line Ldt2 to receive the pixel data Data_G1. The pixel driving circuit DR23 is coupled to the data line Ldt3 to receive the pixel data Data_B1. The pixel driving circuit DR14 is coupled to the data line Ldt4 to receive the pixel data Data_R2. The pixel driving circuits DR15 and DR25 are coupled to the data line Ldt5 to receive the pixel data Data_G2. The pixel driving circuit DR26 is coupled to the data line Ldt6 to receive the pixel data Data_B2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along the second direction D2 in which the data lines Ldt1 to Ldt6 extend, coupled to the anode of the red LED R21 (corresponding to the second LED or the fourth LED) of the same color as the red LED R11. The cathode of the red LED R21 receives the system low voltage VSS. That is, the red LEDs R11 and R21 are connected in series to the pixel driving circuit DR11 and the system low voltage VSS. The green LED G11 is connected in series between the pixel driving circuit DR12 and the system low voltage VSS.

The anode of the red LED R12 (corresponding to the first LED or the third LED) is coupled to the pixel driving circuit DR14 (corresponding to a first pixel driving circuit or a second pixel driving circuit). The cathode of the red LED R12 is, along the second direction D2 in which the data lines Ldt1 to Ldt6 extend, coupled to the anode of the red LED R22 (corresponding to the second LED or the fourth LED) of the same color as the red LED R12. The cathode of the red LED R22 receives the system low voltage VSS. That is, the red LEDs R12 and R22 are connected in series to the pixel driving circuit DR14 and the system low voltage VSS. The green LED G12 is connected in series between the pixel driving circuit DR15 and the system low voltage VSS.

The green LED G21 is connected in series between the pixel driving circuit DR22 and the system low voltage VSS. The anode of the blue LED B21 (corresponding to the first LED or the third LED) is coupled to the pixel driving circuit DR23 (corresponding to a first pixel driving circuit or a second pixel driving circuit). The cathode of the blue LED B21 is, along a direction opposite to the second direction D2 in which the data lines Ldt1 to Ldt6 extend, coupled to the anode of the blue LED B11 (corresponding to the second LED or the fourth LED) of the same color as the blue LED B21. The cathode of the blue LED B11 receives the system low voltage VSS. That is, the blue LEDs B11 and B21 are connected in series to the pixel driving circuit DR23 and the system low voltage VSS.

The green LED G22 is connected in series between the pixel driving circuit DR25 and the system low voltage VSS. The anode of the blue LED B22 (corresponding to the first LED or the third LED) is coupled to the pixel driving circuit DR26 (corresponding to a first pixel driving circuit or a second pixel driving circuit). The cathode of the blue LED B22 is, along the direction opposite to the second direction D2 in which the data lines Ldt1 to Ldt6 extend, coupled to the anode of the blue LED B12 (corresponding to the second LED or the fourth LED) of the same color as the blue LED B22. The cathode of the blue LED B12 receives the system low voltage VSS. That is, the blue LEDs B12 and B22 are connected in series to the pixel driving circuit DR26 and the system low voltage VSS.

Figure 5:
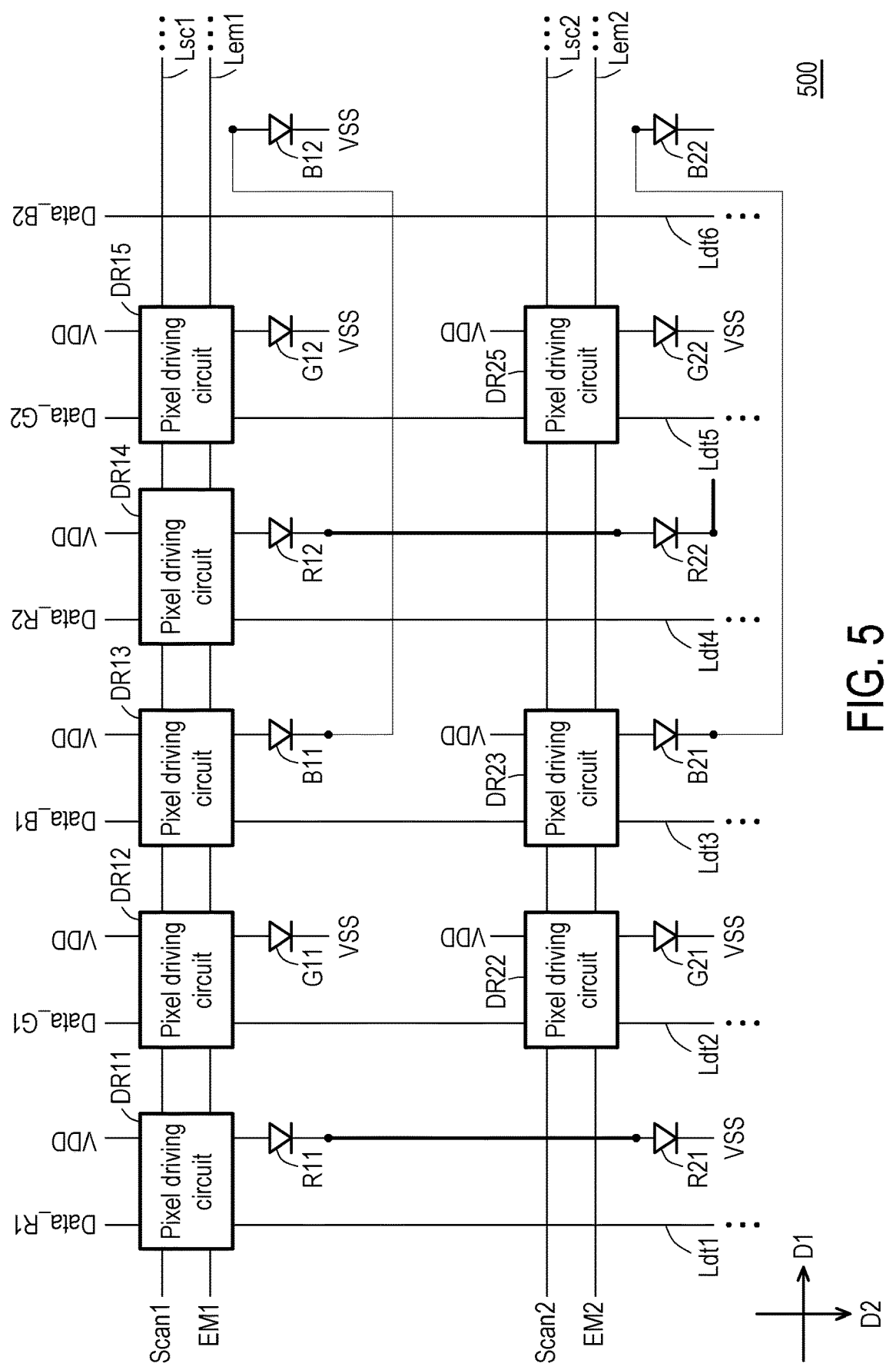
FIG. 5 is a system schematic diagram of a pixel array according to a fifth embodiment of the disclosure.

FIG. 5 is a system schematic diagram of a pixel array according to a fifth embodiment of the disclosure. Referring to FIG. 5, in this embodiment, a pixel array 500 includes multiple pixel driving circuits (exemplified by DR11 to DR15, DR22, DR23, and DR25) and multiple LEDs (exemplified by the red LEDs R11, R12, R21, and R22; the green LEDs G11, G12, G21, and G22; and the blue LEDs B11, B12, B21, and B22). The pixel driving circuits DR11 to DR15, DR22, DR23, and DR25 commonly receive the system high voltage VDD.

The pixel driving circuits DR11 to DR15 are commonly coupled to the scan line Lsc1 to receive the scan signal Scan1. The pixel driving circuits DR22, DR23, and DR25 are commonly coupled to the scan line Lsc2 to receive the scan signal Scan2. The pixel driving circuits DR11 to DR15 are commonly coupled to the light-emitting line Lem1 to receive the light-emitting signal EM1. The pixel driving circuits DR22, DR23, and DR25 are commonly coupled to the light-emitting line Lem2 to receive the light-emitting signal EM2. The pixel driving circuit DR11 is coupled to the data line Ldt1 to receive the pixel data Data_R1. The pixel driving circuits DR12 and DR22 are coupled to the data line Ldt2 to receive the pixel data Data_G1. The pixel driving circuits DR13 and DR23 are coupled to the data line Ldt3 to receive the pixel data Data_B1. The pixel driving circuit DR14 is coupled to the data line Ldt4 to receive the pixel data Data_R2. The pixel driving circuits DR15 and DR25 are coupled to the data line Ldt5 to receive the pixel data Data_G2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along the second direction D2 in which the data lines Ldt1 to Ldt6 extend, coupled to the anode of the red LED R21 (corresponding to the second LED or the fourth LED) of the same color as the red LED R11. The cathode of the red LED R21 receives the system low voltage VSS. That is, the red LEDs R11 and R21 are connected in series to the pixel driving circuit DR11 and the system low voltage VSS. The green LED G11 is connected in series between the pixel driving circuit DR12 and the system low voltage VSS.

The anode of the blue LED B11 (corresponding to the first LED or the third LED) is coupled to the pixel driving circuit DR13 (corresponding to a first pixel driving circuit or a second pixel driving circuit). The cathode of the blue LED B11 is, along the first direction D1 in which the scan lines Lsc1 and Lsc2 extend, coupled to the anode of the blue LED B12 (corresponding to the second LED or the fourth LED) of the same color as the blue LED B11. The cathode of the blue LED B12 receives the system low voltage VSS. That is, the blue LEDs B11 and B12 are connected in series to the pixel driving circuit DR13 and the system low voltage VSS.

The anode of the red LED R12 (corresponding to the first LED or the third LED) is coupled to the pixel driving circuit DR14 (corresponding to a first pixel driving circuit or a second pixel driving circuit). The cathode of the red LED R12 is, along the second direction D2 in which the data lines Ldt1 to Ldt6 extend, coupled to the anode of the red LED R22 (corresponding to the second LED or the fourth LED) of the same color as the red LED R12. The cathode of the red LED R22 receives the system low voltage VSS. That is, the red LEDs R12 and R22 are connected in series to the pixel driving circuit DR14 and the system low voltage VSS. The green LED G12 is connected in series between the pixel driving circuit DR15 and the system low voltage VSS.

The green LED G21 is connected in series between the pixel driving circuit DR22 and the system low voltage VSS. The anode of the blue LED B21 (corresponding to the first LED or the third LED) is coupled to the pixel driving circuit DR23 (corresponding to a first pixel driving circuit or a second pixel driving circuit). The cathode of the blue LED B21 is, along the first direction D1 in which the scan lines Lsc1 and Lsc2 extend, coupled to the anode of the blue LED B22 (corresponding to the second LED or the fourth LED) of the same color as the blue LED B21. The cathode of the blue LED B22 receives the system low voltage VSS. That is, the blue LEDs B21 and B22 are connected in series to the pixel driving circuit DR23 and the system low voltage VSS. The green LED G22 is connected in series between the pixel driving circuit DR25 and the system low voltage VSS.

Figure 6:
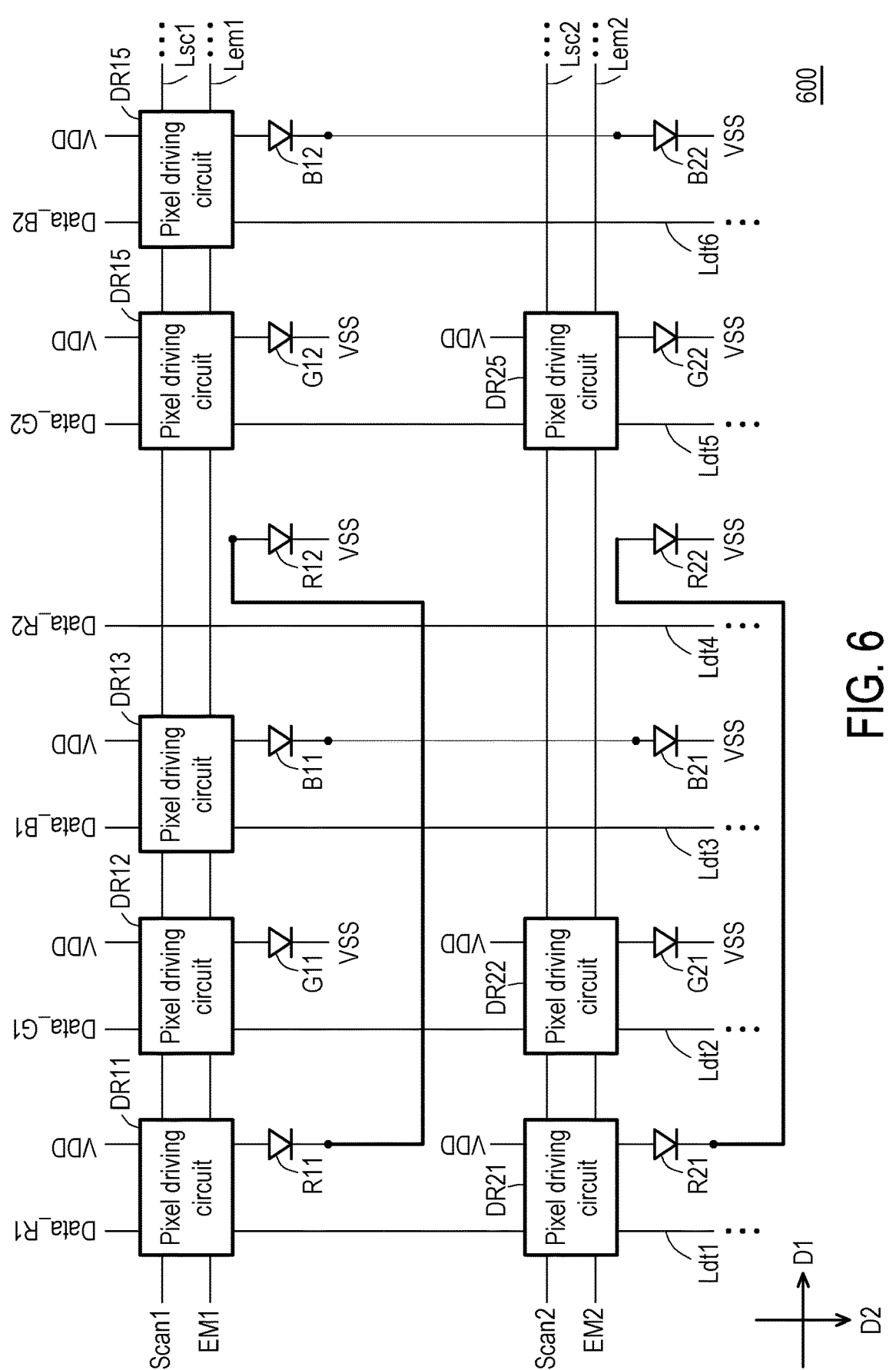
FIG. 6 is a system schematic diagram of a pixel array according to a sixth embodiment of the disclosure.

FIG. 6 is a system schematic diagram of a pixel array according to a sixth embodiment of the disclosure. Referring to FIG. 6, in this embodiment, a pixel array 600 includes multiple pixel driving circuits (exemplified by DR11 to DR13, DR15, DR16, DR21, DR22, and DR25) and multiple LEDs (exemplified by the red LEDs R11, R12, R21, and R22; the green LEDs G11, G12, G21, and G22; and the blue LEDs B11, B12, B21, and B22). The pixel driving circuits DR11 to DR13, DR15, DR16, DR21, DR22, and DR25 commonly receive the system high voltage VDD.

The pixel driving circuits DR11 to DR13, DR15, and DR16 are commonly coupled to the scan line Lsc1 to receive the scan signal Scan1. The pixel driving circuits DR21, DR22, and DR25 are commonly coupled to the scan line Lsc2 to receive the scan signal Scan2. The pixel driving circuits DR11 to DR13, DR15, and DR16 are commonly coupled to the light-emitting line Lem1 to receive the light-emitting signal EM1. The pixel driving circuits DR21, DR22, and DR25 are commonly coupled to the light-emitting line Lem2 to receive the light-emitting signal EM2. The pixel driving circuits DR11 and DR21 are coupled to the data line Ldt1 to receive the pixel data Data_R1. The pixel driving circuits DR12 and DR22 are coupled to the data line Ldt2 to receive the pixel data Data_G1. The pixel driving circuit DR13 is coupled to the data line Ldt3 to receive the pixel data Data_B1. The pixel driving circuits DR15 and DR25 are coupled to the data line Ldt5 to receive the pixel data Data_G2. The pixel driving circuit DR16 is coupled to the data line Ldt6 to receive the pixel data Data_B2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along the first direction D1 in which the scan lines Lsc1 and Lsc2 extend, coupled to the anode of the red LED R12 (corresponding to the second LED or the fourth LED) of the same color as the red LED R11. The cathode of the red LED R12 receives the system low voltage VSS. That is, the red LEDs R11 and R12 are connected in series to the pixel driving circuit DR11 and the system low voltage VSS. The green LED G11 is connected in series between the pixel driving circuit DR12 and the system low voltage VSS.

The anode of the blue LED B11 (corresponding to the first LED or the third LED) is coupled to the pixel driving circuit DR13 (corresponding to a first pixel driving circuit or a second pixel driving circuit). The cathode of the blue LED B11 is, along the second direction D2 in which the data lines Ldt1 to Ldt6 extend, coupled to the anode of the blue LED B21 (corresponding to the second LED or the fourth LED) of the same color as the blue LED B11. The cathode of the blue LED B21 receives the system low voltage VSS. That is, the blue LEDs B11 and B21 are connected in series to the pixel driving circuit DR13 and the system low voltage VSS. The green LED G12 is connected in series between the pixel driving circuit DR15 and the system low voltage VSS.

The anode of the blue LED B12 (corresponding to the first LED or the third LED) is coupled to the pixel driving circuit DR16 (corresponding to a first pixel driving circuit or a second pixel driving circuit). The cathode of the blue LED B12 is, along the second direction D2 in which the data lines Ldt1 to Ldt6 extend, coupled to the anode of the blue LED B22 (corresponding to the second LED or the fourth LED) of the same color as the blue LED B12. The cathode of the blue LED B22 receives the system low voltage VSS. That is, the blue LEDs B12 and B22 are connected in series to the pixel driving circuit DR16 and the system low voltage VSS.

The anode of the red LED R21 (corresponding to the first LED or the third LED) is coupled to the pixel driving circuit DR21 (corresponding to a first pixel driving circuit or a second pixel driving circuit). The cathode of the red LED R21 is, along the first direction D1 in which the scan lines Lsc1 and Lsc2 extend, coupled to the anode of the red LED R22 (corresponding to the second LED or the fourth LED) of the same color as the red LED R21. The cathode of the red LED R22 receives the system low voltage VSS. That is, the red LEDs R21 and R22 are connected in series to the pixel driving circuit DR21 and the system low voltage VSS.

The green LED G21 is connected in series between the pixel driving circuit DR22 and the system low voltage VSS. The green LED G22 is connected in series between the pixel driving circuit DR25 and the system low voltage VSS.

Figure 7:
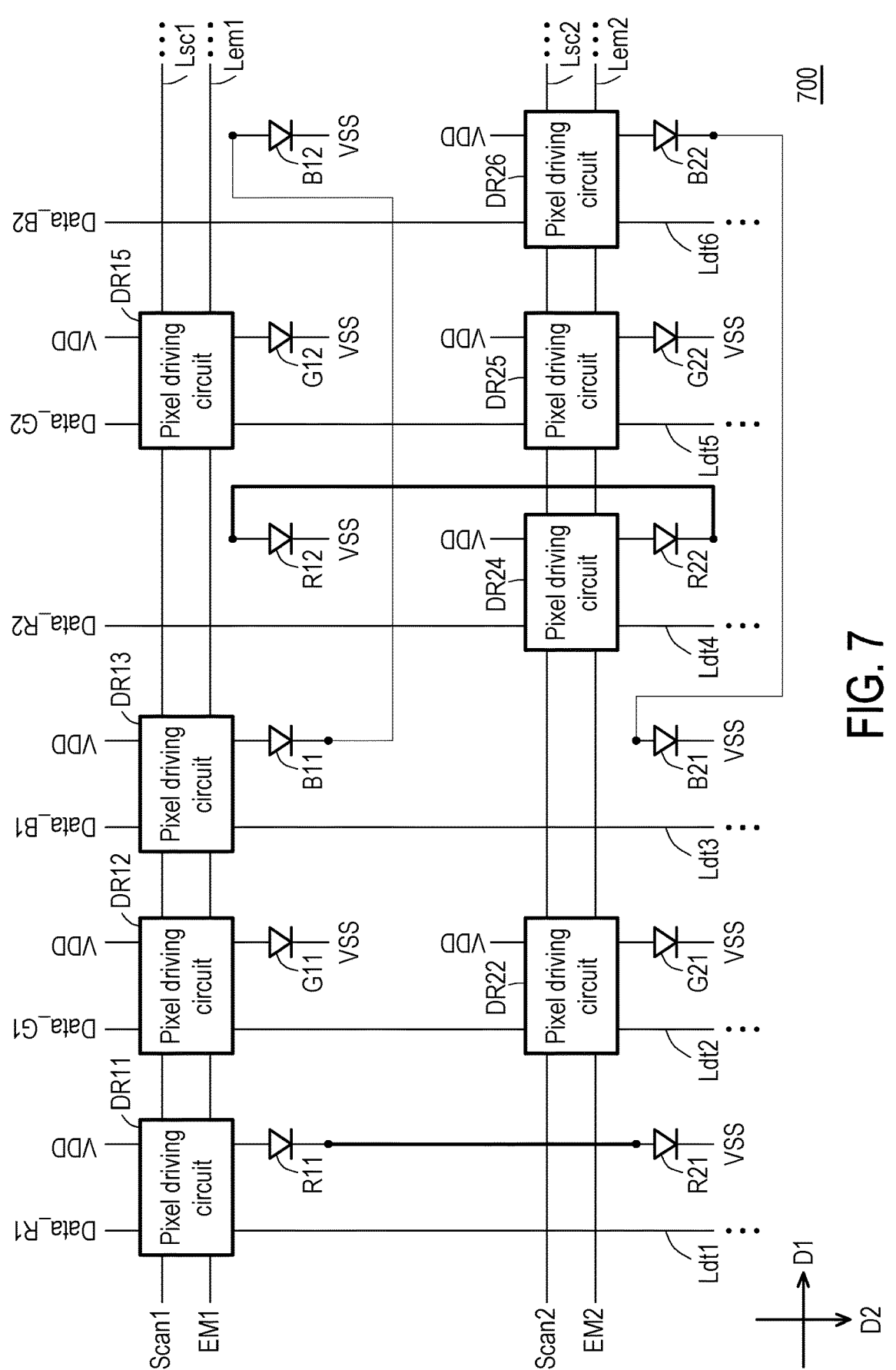
FIG. 7 is a system schematic diagram of a pixel array according to a seventh embodiment of the disclosure.

FIG. 7 is a system schematic diagram of a pixel array according to a seventh embodiment of the disclosure. Referring to FIG. 7, in this embodiment, a pixel array 700 includes multiple pixel driving circuits (exemplified by DR11 to DR13, DR15, DR22, DR24, DR25, and DR26) and multiple LEDs (exemplified by the red LEDs R11, R12, R21, and R22; the green LEDs G11, G12, G21, and G22; and the blue LEDs B1, B12, B21, and B22). The pixel driving circuits DR11 to DR13, DR15, DR22, DR24, DR25, and DR26 commonly receive the system high voltage VDD.

The pixel driving circuits DR11 to DR13 and DR15 are commonly coupled to the scan line Lsc1 to receive the scan signal Scan1. The pixel driving circuits DR22, DR24, DR25, and DR26 are commonly coupled to the scan line Lsc2 to receive the scan signal Scan2. The pixel driving circuits DR11 to DR13 and DR15 are commonly coupled to the light-emitting line Lem1 to receive the light-emitting signal EM1. The pixel driving circuits DR22, DR24, DR25, and DR26 are commonly coupled to the light-emitting line Lem2 to receive the light-emitting signal EM2. The pixel driving circuit DR11 is coupled to the data line Ldt1 to receive the pixel data Data_R1. The pixel driving circuits DR12 and DR22 are coupled to the data line Ldt2 to receive the pixel data Data_G1. The pixel driving circuit DR13 is coupled to the data line Ldt3 to receive the pixel data Data_B1. The pixel driving circuit DR24 is coupled to the data line Ldt4 to receive the pixel data Data_R2. The pixel driving circuits DR15 and DR25 are coupled to the data line Ldt5 to receive the pixel data Data_G2. The pixel driving circuit DR26 is coupled to the data line Ldt6 to receive the pixel data Data_B2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along the second direction D2 in which the data lines Ldt1 to Ldt6 extend, coupled to the anode of the red LED R21 (corresponding to the second LED or the fourth LED) of the same color as the red LED R11. The cathode of the red LED R21 receives the system low voltage VSS. That is, the red LEDs R11 and R21 are connected in series to the pixel driving circuit DR11 and the system low voltage VSS. The green LED G11 is connected in series between the pixel driving circuit DR12 and the system low voltage VSS.

The anode of the blue LED B11 (corresponding to the first LED or the third LED) is coupled to the pixel driving circuit DR13 (corresponding to a first pixel driving circuit or a second pixel driving circuit). The cathode of the blue LED B11 is, along the first direction D1 in which the scan lines Lsc1 and Lsc2 extend, coupled to the anode of the blue LED B12 (corresponding to the second LED or the fourth LED) of the same color as the blue LED B11. The cathode of the blue LED B12 receives the system low voltage VSS. That is, the blue LEDs B11 and B12 are connected in series to the pixel driving circuit DR13 and the system low voltage VSS. The green LED G12 is connected in series between the pixel driving circuit DR15 and the system low voltage VSS.

The green LED G21 is connected in series between the pixel driving circuit DR22 and the system low voltage VSS. The anode of the red LED R22 (corresponding to the first LED or the third LED) is coupled to the pixel driving circuit DR24 (corresponding to a first pixel driving circuit or a second pixel driving circuit). The cathode of the red LED R22 is, along the direction opposite to the second direction D2 in which the data lines Ldt1 to Ldt6 extend, coupled to the anode of the red LED R12 (corresponding to the second LED or the fourth LED) of the same color as the red LED R22. The cathode of the red LED R12 receives the system low voltage VSS. That is, the red LEDs R22 and R12 are connected in series to the pixel driving circuit DR24 and the system low voltage VSS.

The green LED G22 is connected in series between the pixel driving circuit DR25 and the system low voltage VSS. The anode of the blue LED B22 (corresponding to the first LED or the third LED) is coupled to the pixel driving circuit DR26 (corresponding to a first pixel driving circuit or a second pixel driving circuit). The cathode of the blue LED B22 is, along the direction opposite to the first direction D1 in which the scan lines Lsc1 and Lsc2 extend, coupled to the anode of the blue LED B21 (corresponding to the second LED or the fourth LED) of the same color as the blue LED B22. The cathode of the blue LED B21 receives the system low voltage VSS. That is, the blue LEDs B22 and B21 are connected in series to the pixel driving circuit DR26 and the system low voltage VSS.

Figure 8:
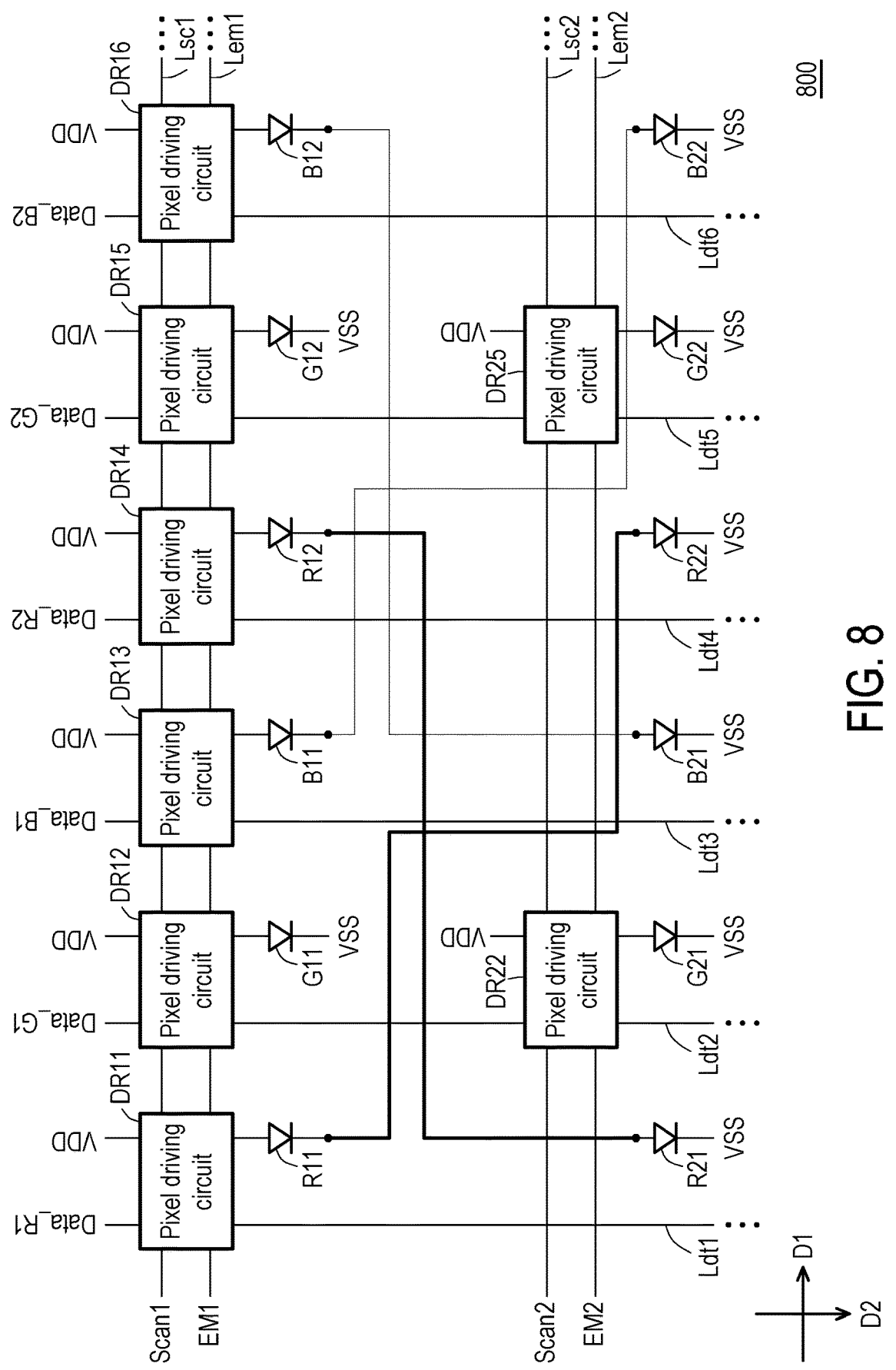
FIG. 8 is a system schematic diagram of a pixel array according to an eighth embodiment of the disclosure.

FIG. 8 is a system schematic diagram of a pixel array according to an eighth embodiment of the disclosure. Referring to FIG. 8, in this embodiment, a pixel array 800 includes multiple pixel driving circuits (exemplified by DR11 to DR16, DR22, and DR25) and multiple LEDs (exemplified by the red LEDs R11, R12, R21, and R22; the green LEDs G11, G12, G21, and G22; and the blue LEDs B1, B12, B21, and B22). The pixel driving circuits DR11 to DR16, DR22, and DR25 commonly receive the system high voltage VDD.

The pixel driving circuits DR11 to DR16 are commonly coupled to the scan line Lsc1 to receive the scan signal Scan1. The pixel driving circuits DR22 and DR25 are commonly coupled to the scan line Lsc2 to receive the scan signal Scan2. The pixel driving circuits DR11 to DR16 are commonly coupled to the light-emitting line Lem1 to receive the light-emitting signal EM1. The pixel driving circuits DR22 and DR25 are commonly coupled to the light-emitting line Lem2 to receive the light-emitting signal EM2. The pixel driving circuit DR11 is coupled to the data line Ldt1 to receive the pixel data Data_R1. The pixel driving circuits DR12 and DR22 are coupled to the data line Ldt2 to receive the pixel data Data_G1. The pixel driving circuit DR13 is coupled to the data line Ldt3 to receive the pixel data Data_B1. The pixel driving circuit DR14 is coupled to the data line Ldt4 to receive the pixel data Data_R2. The pixel driving circuits DR15 and DR25 are coupled to the data line Ldt5 to receive the pixel data Data_G2. The pixel driving circuit DR16 is coupled to the data line Ldt6 to receive the pixel data Data_B2.

The anode of the red LED R11 (corresponding to the first LED or the third LED) is coupled to the pixel driving circuit DR11 (corresponding to a first pixel driving circuit or a second pixel driving circuit). The cathode of the red LED R11 is, along an angular direction between the first direction D1 in which the scan lines Lsc1 and Lsc2 extend and the second direction D2 in which the data lines Ldt1 to Ldt6 extend, coupled to the anode of the red LED R22 (corresponding to the second LED or the fourth LED) of the same color as the red LED R11. The cathode of the red LED R22 receives the system low voltage VSS. That is, the red LEDs R11 and R22 are connected in series to the pixel driving circuit DR11 and the system low voltage VSS. The green LED G11 is connected in series between the pixel driving circuit DR12 and the system low voltage VSS.

The anode of the blue LED B11 (corresponding to the first LED or the third LED) is coupled to the pixel driving circuit DR13 (corresponding to a first pixel driving circuit or a second pixel driving circuit). The cathode of the blue LED B11 is, along the angular direction between the first direction D1 in which the scan lines Lsc1 and Lsc2 extend and the second direction D2 in which the data lines Ldt1 to Ldt6 extend, coupled to the anode of the blue LED B22 (corresponding to the second LED or the fourth LED) of the same color as the blue LED B11. The cathode of the blue LED B22 receives the system low voltage VSS. That is, the blue LEDs B11 and B22 are connected in series to the pixel driving circuit DR13 and the system low voltage VSS.

The anode of the red LED R12 (corresponding to the first LED or the third LED) is coupled to the pixel driving circuit DR14 (corresponding to a first pixel driving circuit or a second pixel driving circuit). The cathode of the red LED R12 is, along an angular direction between the direction opposite to the first direction D1 in which the scan lines Lsc1 and Lsc2 extend and the second direction D2 in which the data lines Ldt1 to Ldt6 extend, coupled to the anode of the red LED R21 (corresponding to the second LED or the fourth LED) of the same color as the red LED R12. The cathode of the red LED R21 receives the system low voltage VSS. That is, the red LEDs R12 and R21 are connected in series to the pixel driving circuit DR14 and the system low voltage VSS. The green LED G12 is connected in series between the pixel driving circuit DR15 and the system low voltage VSS.

The anode of the blue LED B12 (corresponding to the first LED or the third LED) is coupled to the pixel driving circuit DR16 (corresponding to a first pixel driving circuit or a second pixel driving circuit). The cathode of the blue LED B12 is, along the angular direction between the direction opposite to the first direction D1 in which the scan lines Lsc1 and Lsc2 extend and the second direction D2 in which the data lines Ldt1 to Ldt6 extend, coupled to the anode of the blue LED B21 (corresponding to the second LED or the fourth LED) of the same color as the blue LED B12. The cathode of the blue LED B21 receives the system low voltage VSS. That is, the blue LEDs B12 and B21 are connected in series to the pixel driving circuit DR16 and the system low voltage VSS.

The green LED G21 is connected in series between the pixel driving circuit DR22 and the system low voltage VSS. The green LED G22 is connected in series between the pixel driving circuit DR25 and the system low voltage VSS.

Figure 9:
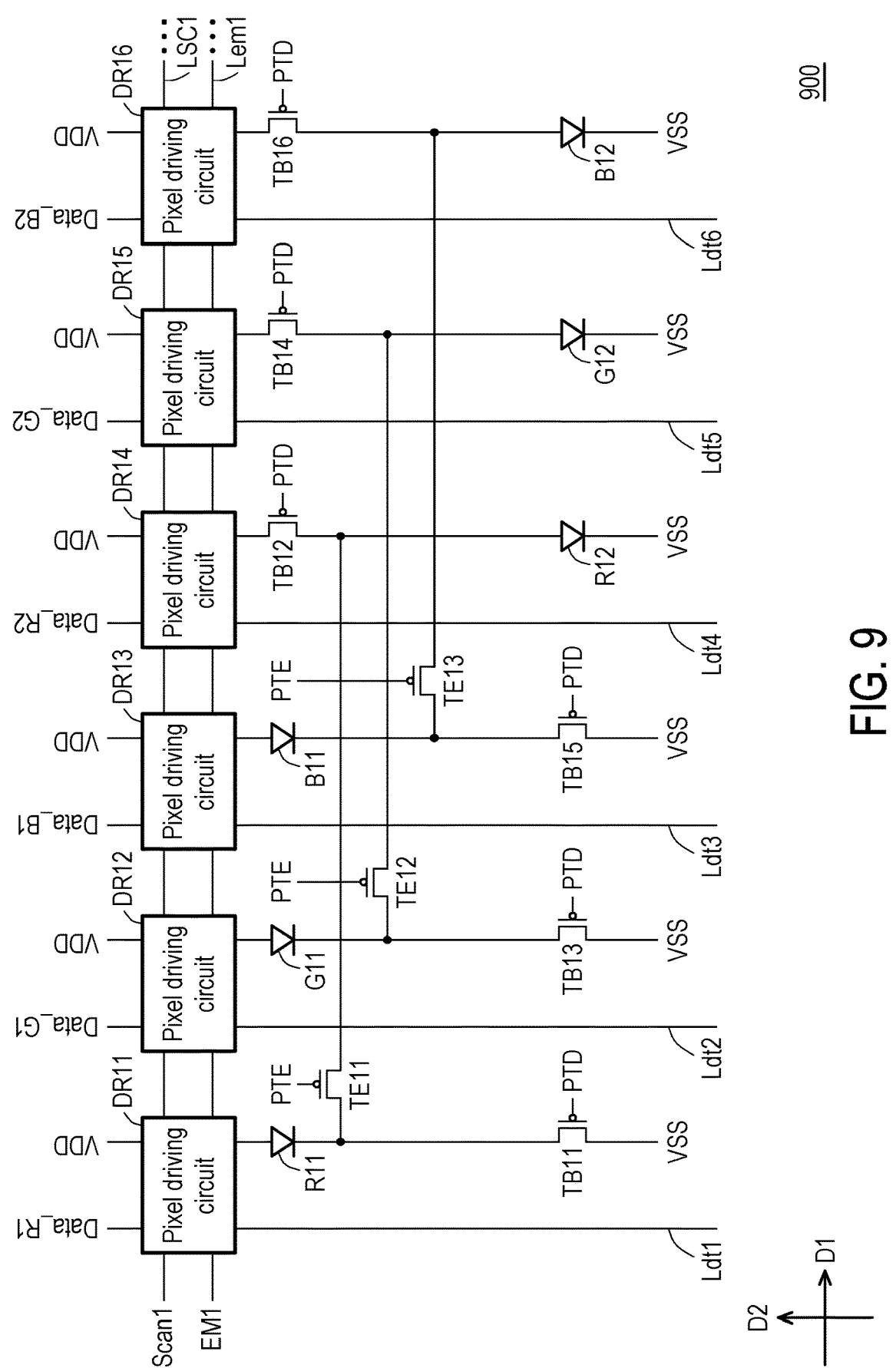
FIG. 9 is a system schematic diagram of a pixel array according to a ninth embodiment of the disclosure.

FIG. 9 is a system schematic diagram of a pixel array according to a ninth embodiment of the disclosure. Referring to FIG. 9, in this embodiment, a pixel array 900 includes multiple pixel driving circuits (exemplified by DR11 to DR16), multiple light-emitting diodes (exemplified by red light-emitting diodes R11 and R12, green light-emitting diodes G11 and G12, and blue light-emitting diodes B11 and B12), multiple transistors TE11 to TE13 and TB11 to TB16. The pixel driving circuits DR11 to DR16 jointly receive the system high voltage VDD, and the transistors TE11 to TE13 and TB11 to TB16 are exemplified by N-type transistors, but the embodiment of the disclosure is not limited thereto.

The pixel driving circuits DR11 to DR16 are jointly coupled to the scan line Lsc1 to receive the scan signal Scan1, and the pixel driving circuits DR11 to DR16 are jointly coupled to the light-emitting line Lem1 to receive the light-emitting signal EM1. The pixel driving circuit DR11 is coupled to the data line Ldt1 to receive the pixel data Data_R1, the pixel driving circuit DR12 is coupled to the data line Ldt2 to receive the pixel data Data_G1, the pixel driving circuit DR13 is coupled to the data line Ldt3 to receive the pixel data Data_B1, the pixel driving circuit DR14 is coupled to the data line Ldt4 to receive the pixel data Data_R2, the pixel driving circuit DR15 is coupled to data line Ldt5 to receive the pixel data Data_G2, and the pixel driving circuit DR16 is coupled to data line Ldt6 to receive the pixel data Data_B2.

The anode of the red LED R11 (corresponding to a first light-emitting diode or a third light-emitting diode) is coupled to the pixel driving circuit DR11 (corresponding to a first pixel driving circuit or a fourth pixel driving circuit). A first terminal of the transistor TB11 (corresponding to a first bypass transistor or a third bypass transistor) is coupled to the cathode of the red LED R11. A control terminal of the transistor TB11 receives a series connection disable signal PTD, and a second terminal of the transistor TB11 receives the system low voltage VSS, that is, the transistor TB11 is connected in series between the cathode of the red LED R11 and the system low voltage VSS.

The anode of the green LED G11 (corresponding to a first light-emitting diode or a third light-emitting diode) is coupled to the pixel driving circuit DR12 (corresponding to a first pixel driving circuit or a fourth pixel driving circuit). A first terminal of the transistor TB13 (corresponding to the first bypass transistor or the third bypass transistor) is coupled to the cathode of the green LED G11. A control terminal of the transistor TB13 receives the series connection disable signal PTD, and a second terminal of the transistor TB13 receives the system low voltage VSS, that is, the transistor TB13 is connected in series between the cathode of the green LED G11 and the system low voltage VSS.

The anode of the blue LED B11 (corresponding to a first light-emitting diode or a third light-emitting diode) is coupled to the pixel driving circuit DR13 (corresponding to a first pixel driving circuit or a fourth pixel driving circuit).

A first terminal of the transistor TB15 (corresponding to the first bypass transistor or the third bypass transistor) is coupled to the cathode of the blue LED B11. A control terminal of the transistor TB15 receives the series connection disable signal PTD, and a second terminal of the transistor TB15 receives the system low voltage VSS, that is, the transistor TB15 is connected in series between the cathode of the blue LED B11 and the system low voltage VSS.

A first terminal of the transistor TB12 (corresponding to a second bypass transistor or a fourth bypass transistor) is coupled to the pixel driving circuit DR14 (corresponding to a third pixel driving circuit or a fifth pixel driving circuit), and a control terminal of the transistor TB12 receives the series connection disable signal PTD. The anode of the red LED R12 (corresponding to a second light-emitting diode or a fourth light-emitting diode) is coupled to a second terminal of the transistor TB12, and the cathode of the red LED R12 receives the system low voltage VSS, that is, the transistor TB12 is connected in series between the pixel driving circuit DR14 and the anode of the red LED R12.

A first terminal of the transistor TB14 (corresponding to the second bypass transistor or the fourth bypass transistor) is coupled to the pixel driving circuit DR15 (corresponding to a third pixel driving circuit or a fifth pixel driving circuit), and a control terminal of the transistor TB14 receives the series connection disable signal PTD. The anode of the green LED G12 (corresponding to a second light-emitting diode or a fourth light-emitting diode) is coupled to a second terminal of the transistor TB14, and the cathode of the green LED G12 receives the system low voltage VSS, that is, the transistor TB14 is connected in series between the pixel driving circuit DR15 and the anode of the green LED G12.

A first terminal of the transistor TB16 (corresponding to the second bypass transistor or the fourth bypass transistor) is coupled to the pixel driving circuit DR16 (corresponding to a third pixel driving circuit or a fifth pixel driving circuit), and a control terminal of the transistor TB16 receives the series connection disable signal PTD. The anode of the blue LED B12 (corresponding to a second light-emitting diode or a fourth light-emitting diode) is coupled to a second terminal of the transistor TB16, and the cathode of the blue LED B12 receives the system low voltage VSS, that is, the transistor TB16 is connected in series between the pixel driving circuit DR16 and the anode of the blue LED B12.

A first terminal of the transistor TE11 (corresponding to a first series connection transistor or a second series connection transistor) is coupled to the cathode of the red LED R11. A control terminal of the transistor TE11 receives a series connection enable signal PTE. The first terminal of the transistor TE11 is coupled to the anode of the red LED R12, that is, the transistor TE11 is connected in series between the cathode of the red LED R11 and the anode of the red LED R12.

A first terminal of the transistor TE12 (corresponding to the first series connection transistor or the second series connection transistor) is coupled to the cathode of the green LED G11. A control terminal of the transistor TE12 receives the series connection enable signal PTE. The first terminal of the transistor TE12 is coupled to the anode of the green LED G12, that is, the transistor TE12 is connected in series between the cathode of the green LED G11 and the anode of the green LED G12.

A first terminal of the transistor TE13 (corresponding to the first series connection transistor or the second series connection transistor) is coupled to the cathode of the blue LED B11. A control terminal of the transistor TE13 receives the series connection enable signal PTE. The first terminal of the transistor TE13 is coupled to the anode of the blue LED B12, that is, the transistor TE13 is connected in series between the cathode of the blue LED B11 and the anode of the blue LED B12.

In this embodiment, the transistors TE11 to TE13 jointly receive the series connection enable signal PTE, and the transistors TB11 to TB16 jointly receive the series connection disable signal PTD. The series connection enable signal PTE and the series connection disable signal PTD can be inverse signals of each other, or the series connection enable signal PTE and the series connection disable signal PTD can only enable one of them, depending on the circuit design. However, the embodiment of the disclosure is not limited thereto.

According to the above, in this embodiment, when the transistors TE11 to TE13 are turned on, the transistors TB11 to TB16 are not turned on (or cut off), so that the cathode of the red LED R11 is coupled to the anode of the red LED R12, the cathode of THE green LED G11 is coupled to the anode of the green LED G12, and the cathode of the blue LED B11 is coupled to the anode of the blue LED B12, that is, the red LED R11 is connected in series to the red LED R12, the green LED G11 is connected in series to the green LED G12, and the blue LED B11 is connected in series to the blue LED B12.

At this time, the red LEDs R11 and R12 are driven through the pixel driving circuit DR11, the green LEDs G11 and G12 are driven through the pixel driving circuit DR12, and the blue LEDs B11 and B12 are driven through the pixel driving circuit DR13, that is, the pixel driving circuits DR14 to DR16 are isolated from the red LEDs R11 and R12, the green LEDs G11 and G12, and the blue LEDs B11 and B12. Since the pixel driving circuits DR14 to DR16 are not used to drive the red LEDs R11 and R12, the green LEDs G11 and G12, and the blue LEDs B11 and B12, the pixel driving circuits DR14 to DR16 can not be operated to save power consumption.

On the other hand, when the transistors TB11 to TB16 are turned on, the transistors TE11 to TE13 are not turned on (or cut off), so that the cathodes of the red LED R11, the green LED G11, and the blue LED B11 receive the system low voltage VSS, the anode of the red LED R12 is coupled to the pixel driving circuit DR13, the anode of the green LED G12 is coupled to the pixel driving circuit DR14, and the anode of the blue LED B12 is coupled to the pixel driving circuit DR15. At this time, the red LEDs R11 and R12, the green LEDs G11 and G12, and the blue LEDs B11 and B12 are driven by the pixel driving circuits DR11 to DR16 respectively to display the original resolution picture.

Based on the above, through the configuration of the transistors TE11 to TE13 and TB11 to TB16, the red LEDs R11 and R12, the green LEDs G11 and G12, the blue LEDs B11 and B12, and the pixel driving circuits DR11 to DR16 can be operated in power saving mode or normal display mode, so that the pixel array 900 can save power consumption in specific application environments, such as displaying still images or transitions.

Figure 10:
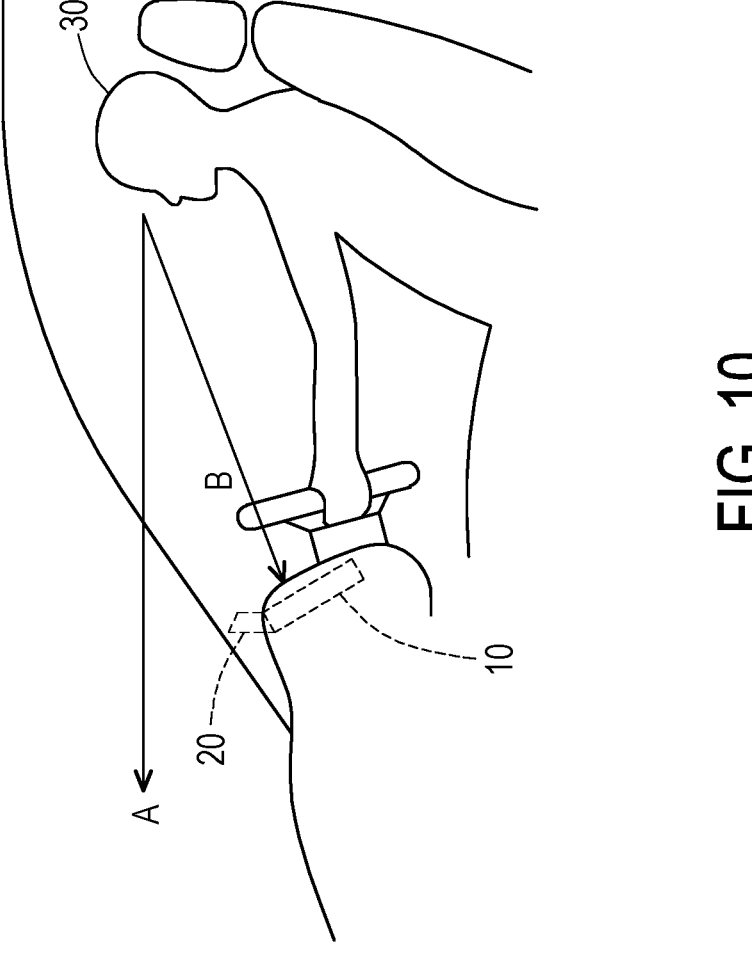
FIG. 10 is an environment schematic diagram of a display device applying the pixel array according to the ninth embodiment of the disclosure.

FIG. 10 is an environment schematic diagram of a display device applying the pixel array according to the ninth embodiment of the disclosure. Referring to FIG. 9 and FIG. 10, in this embodiment, for example, the pixel array 900 is applied in a display device 10 of the vehicle. Furthermore, a user 30 (such as a driver) may be looking at the road (as shown in a line of sight A) or may be looking at the dashboard (as shown in a line of sight B).

When the user 30 is looking at the road (that is, when the display device 10, i.e., the dashboard, applying the pixel array 900 is out of the line of sight A of the user 30), the series connection enable signal PTE is disabled and the series connection enable signal PTE is enabled, so that the pixel array 900 operates in power saving mode. When the user 30 is looking at the dashboard (that is, when the display device 10 applying the pixel array 900 is located in the line of sight B of the user 30), the series connection enable signal PTE is enabled and the series connection disable signal PTD is disabled, so that the pixel array 900 operates in normal display mode.

In this embodiment, the line of sight of the user 30 can be determined through a camera 20 or similar components, thereby determining whether the pixel array 900 operates in the power saving mode or the normal display mode.

Figure 11:
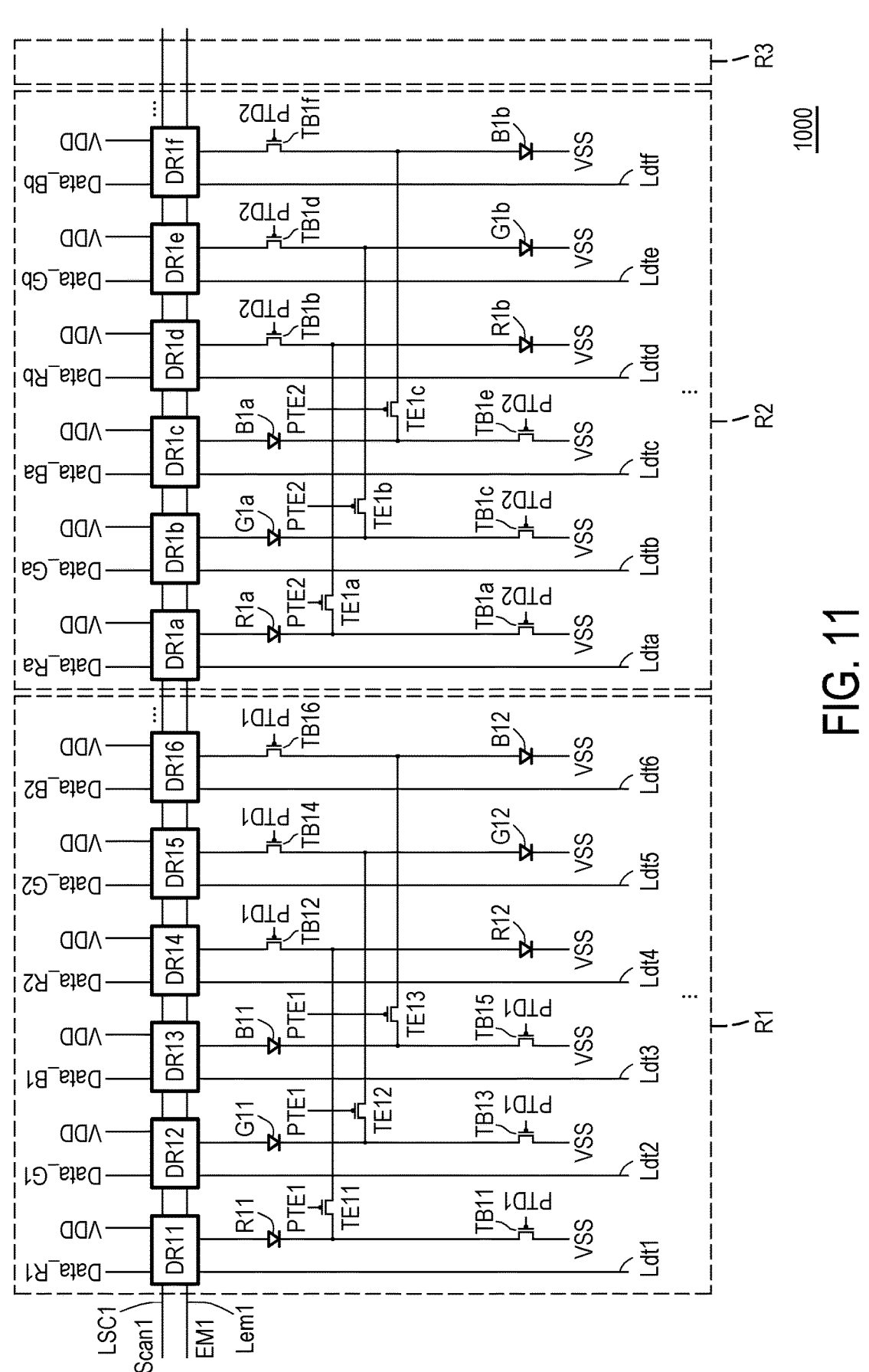
FIG. 11 is a system schematic diagram of a pixel array according to a tenth embodiment of the disclosure.

FIG. 11 is a system schematic diagram of a pixel array according to a tenth embodiment of the disclosure. Referring to FIG. 9 and FIG. 11, in this embodiment, 1000 has multiple display areas (such as display areas R1 to R3). Furthermore, the display area R1 (corresponding to a first display area) is configured with, for example, the pixel driving circuits DR11 to DR16, red LEDs R11 and R12, green LEDs G11 and G12, blue LEDs B11 and B12, and the transistors TE11 to TE13 and TB11 to TB16. The display area R2 (corresponding to a second display area) is configured with, for example, pixel driving circuits DR1a to DR1f, red LEDs Ria and Rib, green LEDs G1a and G1b, blue LEDs B1a and B1b, and transistors TE1a to TE1c and TB1a to TB1f.

The pixel driving circuits DR1a to DR1f are jointly coupled to the scan line Lsc1 to receive the scan signal Scan1, and the pixel driving circuits DR1a to DR1f are jointly coupled to the light-emitting line Lem1 to receive the light-emitting signal EM1. The pixel driving circuit DR1a is coupled to a data line Ldta to receive a pixel data Data_Ra, the pixel driving circuit DR1b is coupled to a data line Ldtb to receive a pixel data Data_Ga, the pixel driving circuit DR1c is coupled to a data line Ldtc to receive a pixel data Data_Ba, and the pixel driving circuit DR1d is coupled to a data line Ldtb to receive a pixel data Data_Rb, the pixel driving circuit DR1e is coupled to a data line Ldte to receive a pixel data Data_Gb, and the pixel driving circuit DR1f is coupled to a data line Ldtf to receive a pixel data Data_Bf.

The circuit structures of the pixel driving circuit DR1i to DR16, the red LEDs R11 and R12, the green LEDs G11 and G12, the blue LEDs B11 and B12, and the transistors TE11 to TE13 and TB11 to TB16 are generally the same as those of the pixel array 900. The difference is that the transistors TE11 to TE13 (corresponding to the first series connection transistor) jointly receive a first series connection enable signal PTE1 and the transistors TB11 to TB16 (corresponding to the first bypass transistor and the second bypass transistor) jointly receive a first series connection disable signal PTD1.

The circuit structures of the pixel driving circuits DR1a to DR1f, the red LEDs Ria and Rib, the green LEDs G1a and G1b, the blue LEDs B1a and B1b, and the transistors TE1a to TE1c and TB1a to TB1f are generally the same as the pixel array 900. The difference is that the transistors TE1a to TE1c (corresponding to the second series connection transistor) jointly receive a second series connection enable signal PTE2, which is independent of the first series connection enable signal PTE1, and that the transistors TB1a to TB1f (corresponding to the third bypass transistor and the fourth bypass transistor) jointly receive a second series connection disable signal PTD2, which is independent of the first series connection disable signal PTD1.

In the embodiment of the disclosure, when the display area R1 is determined to be a display hot spot based on the image data used to generate pixel data (such as Data_R1, Data_G1, Data_B1, Data_R2, Data_G2, Data_B2, Data_Ra, Data_Ga, Data_Ba, Data_Rb, Data_Gb, Data_Bb), the first series connection enable signal PTE1 is enabled and the first series connection disable signal PTD1 is disabled. When the display area R1 is determined not to be a display hot spot, the first series connection enable signal PTE1 is disabled and the first series connection disable signal PTD1 is enabled.

Similarly, when the display area R2 is determined to be a display hot spot based on the image data, the second series connection enable signal PTE2 is enabled and the second series connection disable signal PTD2 is disabled. When the display area R2 is determined not to be a display hot spot, the second series connection enable signal PTE2 is disabled and the second series connection disable signal PTD2 is enabled.

In the embodiment of the disclosure, when the image displayed by the display area R2 is determined to include a dynamic image based on the image data, the display area R1 is determined to be a display hot area; similarly, when the image displayed by the display area R2 is determined to include a dynamic image based on the image data, the display area R2 is determined to be a display hot spot.

In the embodiments of FIGS. 1 to 11, the same or similar reference numerals are used for the same or similar elements to make the differences between the embodiments more comprehensible, but the embodiments of the disclosure are not limited thereto.

In the embodiment of the disclosure, a cathode of one of the red LEDs R11, R12, R21, and R22 as well as the blue LEDs B11, B12, B21, and B22 may be, along the first direction D1 in which the scan lines Lsc1 and Lsc2 extend, coupled to an anode of an LED of the same color.

In the embodiment of the disclosure, a cathode of one of the red LEDs R11, R12, R21, and R22 as well as the blue LEDs B11, B12, B21, and B22 is, along the direction opposite to the first direction D1 in which the scan lines Lsc1 and Lsc2 extend, coupled to an anode of an LED of the same color.

In the embodiment of the disclosure, a cathode of one of the red LEDs R11, R12, R21, and R22 as well as the blue LEDs B11, B12, B21, and B22 is, along the second direction D2 in which the data lines Ldt1 to Ldt6 extend, coupled to an anode of an LED of the same color.

In the embodiment of the disclosure, a cathode of one of the red LEDs R11, R12, R21, and R22 as well as the blue LEDs B11, B12, B21, and B22 is, along the direction opposite to the second direction D2 in which the data lines Ldt1 to Ldt6 extend, coupled to an anode of an LED of the same color.

In the embodiment of the disclosure, a cathode of one of the red LEDs R11, R12, R21, and R22 as well as the blue LEDs B11, B12, B21, and B22 is, along the angular direction between the first direction D1 in which the scan lines Lsc1 and Lsc2 extend and the second direction D2 in which the data lines Ldt1 to Ldt6 extend, coupled to an anode of an LED of the same color.

In the embodiment of the disclosure, a cathode of one of the red LEDs R11, R12, R21, and R22 as well as the blue LEDs B11, B12, B21, and B22 is, along the angular direction between the direction opposite to the first direction D1 in which the scan lines Lsc1 and Lsc2 extend and the second direction D2 in which the data lines Ldt1 to Ldt6 extend, coupled to an anode of an LED of the same color.

In the embodiment of the disclosure, a cathode of one of the red LEDs R11, R12, R21, and R22 as well as the blue LEDs B11, B12, B21, and B22 is, along an angular direction between the first direction D1 in which the scan lines Lsc1 and Lsc2 extend and the direction opposite to the second direction D2 in which the data lines Ldt1 to Ldt6 extend, coupled to an anode of an LED of the same color.

In the embodiment of the disclosure, a cathode of one of the red LEDs R11, R12, R21, and R22 as well as the blue LEDs B11, B12, B21, and B22 is, along an angular direction between the direction opposite to the first direction D1 in which the scan lines Lsc1 and Lsc2 extend and the direction opposite to the second direction D2 in which the data lines Ldt1 to Ldt6 extend, coupled to an anode of an LED of the same color.

In summary, in the pixel array in the embodiment of the disclosure, the more sensitive green LEDs are independently driven, while the less sensitive red LEDs and blue LEDs are driven in groups according to color. However, the red LEDs and the blue LEDs lighting up at the same time are located in different positions. Thus, the pixel array reduces power consumption of light-emitting diodes and prevents problems of grid points in terms of visual effects. In addition, the configuration of the series connection transistors and the bypass transistors allows the light-emitting diodes of the pixel array to be operated in either series mode (i.e., power saving mode) or stand-alone mode (i.e., normal display mode), which in turn allows the pixel array to save power consumption in specific applications.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A pixel array, comprising:
   a plurality of pixel driving circuits, individually coupled to one of a plurality of scan lines to receive a scan signal, coupled to one of a plurality of light-emitting lines to receive a light-emitting signal, and coupled to one of a plurality of data lines to receive a pixel data;
   a plurality of light-emitting diodes, arranged in an array, wherein an anode of a first light-emitting diode of the plurality of light-emitting diodes is coupled to a first pixel driving circuit of the plurality of pixel driving circuits, and a cathode of the first light-emitting diode is coupled to an anode of a second light-emitting diode of the plurality of light-emitting diodes of a same color as the first light-emitting diode, wherein a cathode of the second light-emitting diode receives a system low voltage;
   a first series connection transistor, connected in series between the cathode of the first light-emitting diode and the anode of the second light-emitting diode;
   a first bypass transistor, connected in series between the cathode of the first light-emitting diode and the system low voltage; and
   a second bypass transistor, connected in series between a third pixel driving circuit of the plurality of pixel driving circuits and the anode of the second light-emitting diode,
   wherein when the first series connection transistor is turned on, the first bypass transistor and the second bypass transistor are not turned on, and when the first bypass transistor and the second bypass transistor are turned on, the first series connection transistor is not turned on.

2. The pixel array according to claim 1, wherein the cathode of the first light-emitting diode is coupled to the anode of the second light-emitting diode along a first direction in which the plurality of scan lines extend.

3. The pixel array according to claim 1, wherein the cathode of the first light-emitting diode is coupled to the anode of the second light-emitting diode along a direction opposite to a first direction in which the plurality of scan lines extend.

4. The pixel array according to claim 1, wherein the cathode of the first light-emitting diode is coupled to the anode of the second light-emitting diode along a second direction in which the plurality of data lines extend.

5. The pixel array according to claim 1, wherein the cathode of the first light-emitting diode is coupled to the anode of the second light-emitting diode along a direction opposite to a second direction in which the plurality of data lines extend.

6. The pixel array according to claim 1, wherein the cathode of the first light-emitting diode is coupled to the anode of the second light-emitting diode along an angular direction between a first direction in which the plurality of scan lines extend and a second direction in which the plurality of data lines extend.

7. The pixel array according to claim 1, wherein the cathode of the first light-emitting diode is coupled to the anode of the second light-emitting diode along an angular direction between a direction opposite to a first direction in which the plurality of scan lines extend and a second direction in which the plurality of data lines extend.

8. The pixel array according to claim 1, wherein the cathode of the first light-emitting diode is coupled to the anode of the second light-emitting diode along an angular direction between a first direction in which the plurality of scan lines extend and a direction opposite to a second direction in which the plurality of data lines extend.

9. The pixel array according to claim 1, wherein the cathode of the first light-emitting diode is coupled to the anode of the second light-emitting diode along an angular direction between a direction opposite to a first direction in which the plurality of scan lines extend and a direction opposite to a second direction in which the plurality of data lines extend.

10. The pixel array according to claim 1, wherein the first light-emitting diode is one of a red light-emitting diode and a green light-emitting diode.

11. The pixel array according to claim 1, wherein an anode of a third light-emitting diode of the plurality of light-emitting diodes of a different color from the first light-emitting diode is coupled to a second pixel driving circuit of the plurality of pixel driving circuits, and a cathode of the third light-emitting diode is coupled to an anode of a fourth light-emitting diode of the plurality of light-emitting diodes of a same color as the third light-emitting diode, wherein a cathode of the fourth light-emitting diode receives the system low voltage.

12. The pixel array according to claim 11, wherein the first light-emitting diode and the third light-emitting diode are individually a red light-emitting diode and a blue light-emitting diode.

13. The pixel array according to claim 1 further comprising:
a second series connection transistor, connected in series between a cathode of a third light-emitting diode different from the first light-emitting diode of the plurality of light-emitting diodes and an anode of a fourth light-emitting diode of the same color as the third light-emitting diode, wherein an anode of the third light-emitting diode is coupled to a fourth pixel driving circuit of the plurality of pixel driving circuits, and a cathode of the fourth light-emitting diode receives the system low voltage;
a third bypass transistor, connected in series between the cathode of the third light-emitting diode and the system low voltage; and
a fourth bypass transistor, connected in series between a fifth pixel driving circuit of the plurality of pixel driving circuits and the anode of the fourth light-emitting diode,
wherein when the second series connection transistor is turned on, the third bypass transistor and the fourth bypass transistor are not turned on, and when the third bypass transistor and the fourth bypass transistor are turned on, the second series connection transistor is not turned on.

14. The pixel array according to claim 13, wherein the first series connection transistor and the second series connection transistor jointly receive a series connection enable signal, and the first bypass transistor, the second bypass transistor, the third bypass transistor, and the fourth bypass transistor jointly receive a series connection disable signal.

15. The pixel array according to claim 14, wherein when a display device applying the pixel array is located in a line of sight of a user, the series connection enable signal is enabled and the series connection disable signal is disabled, when the display device applying the pixel array is located out of the line of sight of the user, the series connection enable signal is disabled and the series connection disable signal is enabled.

16. The pixel array according to claim 13, further comprising a plurality of display areas, wherein the first series connection transistor in a first display area of the plurality of display areas receives a first series connection enable signal, the second series connection transistor in a second display area of the plurality of display areas receives a second series connection enable signal independent of the first series connection enable signal, the first bypass transistor and the second bypass transistor in the first display area jointly receive a first series connection disable signal, and the third bypass transistor and the fourth bypass transistor in the second display area jointly receive a second series connection disable signal independent of the first series connection disable signal.

17. The pixel array according to claim 16, wherein when the first display area is determined to be a display hot spot based on an image data, the first series connection enable signal is enabled and the first series connection disable signal is disabled, when the first display area is determined not to be the display hot spot, the first series connection enable signal is disabled and the first series connection disable signal is enabled, when the second display area is determined to be the display hot spot based on the image data, the second series connection enable signal is enabled and the second series connection disable signal is disabled, when the second display area is determined not to be the display hot spot, the second series connection enable signal is disabled and the second series connection disable signal is enabled.

18. The pixel array according to claim 17, wherein when the first display area is determined to display a dynamic image based on the image data, the first display area is determined to be the display hot area, when the second display area is determined to display the dynamic image based on the image data, the second display area is determined to be the display hot area.

19. The pixel array according to claim 1, wherein the plurality of light-emitting diodes comprise a plurality of micro light-emitting diodes.

* * * * *